US008994920B1

(12) United States Patent
Johnson

(10) Patent No.: US 8,994,920 B1
(45) Date of Patent: Mar. 31, 2015

(54) OPTICAL SYSTEMS AND METHODS FOR ABSORBANCE MODULATION

(76) Inventor: Kenneth C. Johnson, Santa Clara, CA (US)

(*) Notice: Subject to any disclaimer, the term of this patent is extended or adjusted under 35 U.S.C. 154(b) by 820 days.

(21) Appl. No.: 13/103,874

(22) Filed: May 9, 2011

Related U.S. Application Data

(60) Provisional application No. 61/332,694, filed on May 7, 2010, provisional application No. 61/334,993, filed on May 14, 2010, provisional application No. 61/360,416, filed on Jun. 30, 2010, provisional application No. 61/373,784, filed on Aug. 13, 2010, provisional application No. 61/376,547, filed on Aug. 24, 2010, provisional application No. 61/381,359, filed on Sep. 9, 2010, provisional application No. 61/382,871, filed on Sep. 14, 2010, provisional application No. 61/391,917, filed on Oct. 11, 2010, provisional application No. 61/413,867, filed on Nov. 15, 2010.

(51) Int. Cl.
*G03F 7/20* (2006.01)
*G02B 27/42* (2006.01)

(52) U.S. Cl.
CPC .......... *G03F 7/7015* (2013.01); *G02B 27/4222* (2013.01)
USPC ....................................................... 355/55

(58) Field of Classification Search
CPC ........... G03F 7/7015; G03F 1/26; G02B 3/10; G02B 27/4222; G02B 27/4244
USPC ................................. 355/55, 67, 53
See application file for complete search history.

(56) References Cited

U.S. PATENT DOCUMENTS

| 5,161,057 | A | 11/1992 | Johnson |
| 5,212,588 | A | 5/1993 | Viswanathan et al. |
| 5,589,982 | A | 12/1996 | Faklis et al. |
| 5,900,637 | A | 5/1999 | Smith |
| 6,133,986 | A | 10/2000 | Johnson |

(Continued)

OTHER PUBLICATIONS

Bass, M., *Handbook of Optics*, 2nd ed. (Optical Society of America, Washington, DC, 1995,) vol. 2, pp. 1.23-26 and 18.15, 7 pages.

(Continued)

*Primary Examiner* — Peter B Kim
(74) *Attorney, Agent, or Firm* — Kilpatrick Townsend & Stockton LLP

(57) ABSTRACT

Optical radiation patterns at two wavelengths, an "imaging" wavelength and a "masking" wavelength, are superimposed on a photochromic layer, wherein the masking wavelength induces optical absorbance in the layer, allowing the imaging wavelength to transmit only through narrow transmittance zones where the masking-wavelength radiation has an optical null. The patterns are preferably formed as a focal-point array. At each focal point a focused-radiation spot at the imaging wavelength is superimposed with an annular-radiation spot at the masking wavelength. The spots may be generated by an array of microlenses with focal points proximate the layer. (Several novel types of dual-wavelength microlenses are disclosed.) Alternatively, the focused-radiation spots may be generated in separate optical paths for the two wavelengths, and optically combined at the photochromic layer by means of beam-combining and projection optics. The radiation patterns can also comprise full-field images, which are formed by separate photomasks for the two wavelengths.

1 Claim, 19 Drawing Sheets

(56) References Cited

U.S. PATENT DOCUMENTS

| | | | |
|---|---|---|---|
| 6,177,980 B1 | 1/2001 | Johnson | |
| 6,214,633 B1 | 4/2001 | Clark et al. | |
| 6,238,852 B1 | 5/2001 | Klosner | |
| 6,331,710 B1 | 12/2001 | Wang et al. | |
| 6,424,404 B1 | 7/2002 | Johnson | |
| 6,498,685 B1 | 12/2002 | Johnson | |
| 6,639,201 B2 | 10/2003 | Almogy et al. | |
| 6,897,941 B2 | 5/2005 | Almogy | |
| 6,960,773 B2 | 11/2005 | Menon et al. | |
| 7,079,306 B2 | 7/2006 | McGeoch | |
| 7,116,405 B2 | 10/2006 | Johnson | |
| 7,239,373 B2 | 7/2007 | Tinnemans et al. | |
| 7,846,649 B2 | 12/2010 | Tirosh et al. | |
| 7,859,647 B2 | 12/2010 | Bleeker et al. | |
| 8,687,277 B2 | 4/2014 | Johnson | |
| 2008/0298552 A1 | 12/2008 | Derra et al. | |
| 2009/0046299 A1 | 2/2009 | Menon et al. | |
| 2010/0079739 A1 | 4/2010 | Goehnermeier et al. | |
| 2010/0097703 A1* | 4/2010 | Menon et al. | 359/565 |
| 2013/0258305 A1 | 10/2013 | Johnson | |

OTHER PUBLICATIONS

Bomzon et al., "Radially and azimuthally polarized beams generated by space-variant dielectric subwavelength gratings," Optics Letters vol. 27(5), 2002, pp. 285-287.

Brandt, et al., "LPP EUV Source Development for HVM," in Proceedings of SPIE vol. 6517, Emerging Lithographic Technologies XI, M. J. Lercel, Ed., 65170Q, 2007, 10 pages.

Burnett et al., "Birefringence issues with uniaxial crystals as last lens elements for high-index immersion lithography," Proceedings SPIE 7274, 2009, pp. 727421-1-727421-11.

Constancias et al., "Fabrication of large area ultrathin silicon membrane: Application for high efficiency extreme ultraviolet diffraction gratings," Journal of Vacuum Science & Technology, 2010, B 28, pp. 194-197.

Fritze et al., "Gratings of regular arrays and trim exposures for ultralarge scale integrated circuit phase-shift lithography," Journal of Vacuum Science & Technology, 2001, B 19(6), 2366-2370.

Goldstein et al., "EUV micro-exposure tool at 0.5 NA for sub-16 nm lithography," Optics Letters, 2008, 33(4), pp. 2995-2997.

Goodman, J. W., *An Introduction to Fourier Optics*, 1996, Sect. 3.4.2, pp. 44-45, 4 pages, McGraw-Hill.

Jung et al., "Selective dry etching of attenuated phase-shift mask materials for extreme ultraviolet lithography using inductively coupled plasmas," Journal of Vacuum Science & Technology, 2009, B 27, pp. 2361-2365.

Kingslake, R., *Lens Design Fundamentals*, Academic Press, London, 1978, pp. 89-92, 6 pages.

Menon et al., "Absorbance-modulation optical lithography," Journal of the Optical Society of America A, 2006, vol. 23, Issue 9, pp. 2290-2294.

Menon et al., "Design of diffractive lenses that generate optical nulls without phase singularities," Journal of the Optical Society of America A, 2009, vol. 26, Issue 2, pp. 297-304.

Miyamoto, K., "The Phase Fresnel Lens," Journal of the Optical Society of America, vol. 51(1), 1961, pp. 17-20.

Nam et al., "Potential of Solid Immersion Lithography using I-line and KrF light source," Proceedings SPIE 5745, 2005, pp. 1049-1055.

Pelletier et al., "Aluminum nanowire polarizing grids: Fabrication and analysis," Applied Physics Letters, vol. 88, 2006, pp. 211114-1-211114-3.

Richter et al., "Design considerations of form birefringent microstructures," Applied Optics, 1995, vol. 34(14), pp. 2421-2429.

Salmassi et al., "Multilayer phase-only diffraction gratings: Fabrication and application to extreme ultraviolet optics," Journal of Vacuum Science & Technology, B 25, 2007, 17 pages.

Smith et al., "25nm Immersion Lithography at a 193nm Wavelength," Proceedings SPIE 5745, 2004, pp. 141-147.

Tsai et al., "Fabrication of spiral-phase diffractive elements using scanning-electron beam-lithography," Journal of Vacuum Science & Technology, 2007, B 25, pp. 2068-2071.

Tsai et al., "Far-Field Optical Imaging at the Nanoscale via Absorbance Modulation," *Novel Techniques in Microscopy*, OSA Technical Digest (CD,) Optical Society of America, 2009, paper NMA2, 3 pages.

Watanabe et al., "Generation of a doughnut-shaped beam with a spiral phase plate," Review of Scientific Instruments, vol. 75, 2004, 5131-5135.

Williamson, D. M., "Evolution of ring-field systems in microlithography," SPIE Proceedings, 1998, vol. 3482, 8 pages.

Yoder, "Opto-Mechanical Systems Design, Third Edition," CRC Press, 2006, pp. 368-370, 5 pages.

Zimmerman et al., "High Index 193 nm Immersion Lithography: The Beginning or the End of the Road," Proceedings of SPIE 7274, 2009, pp. 727420-1-727420-11.

U.S. Appl. No. 61/498,427, filed Jun. 17, 2011 for Johnson.
U.S. Appl. No. 61/521,684, filed Aug. 9, 2011 for Johnson.
U.S. Appl. No. 61/525,125, filed Aug. 18, 2011 for Johnson.
U.S. Appl. No. 61/531,981, filed Sep. 7, 2011 for Johnson.
U.S. Appl. No. 61/549,158, filed Oct. 19, 2011 for Johnson.
U.S. Appl. No. 13/523,843, filed Jun. 14, 2012 for Johnson.
International Search Report and Written Opinion for International PCT Application No. PCT/US2014/043462, mailed Oct. 24, 2014, 16 pages.
Non-Final Office Action for U.S. Appl. No. 13/801,919, mailed Nov. 19, 2014, 8 pages.

* cited by examiner

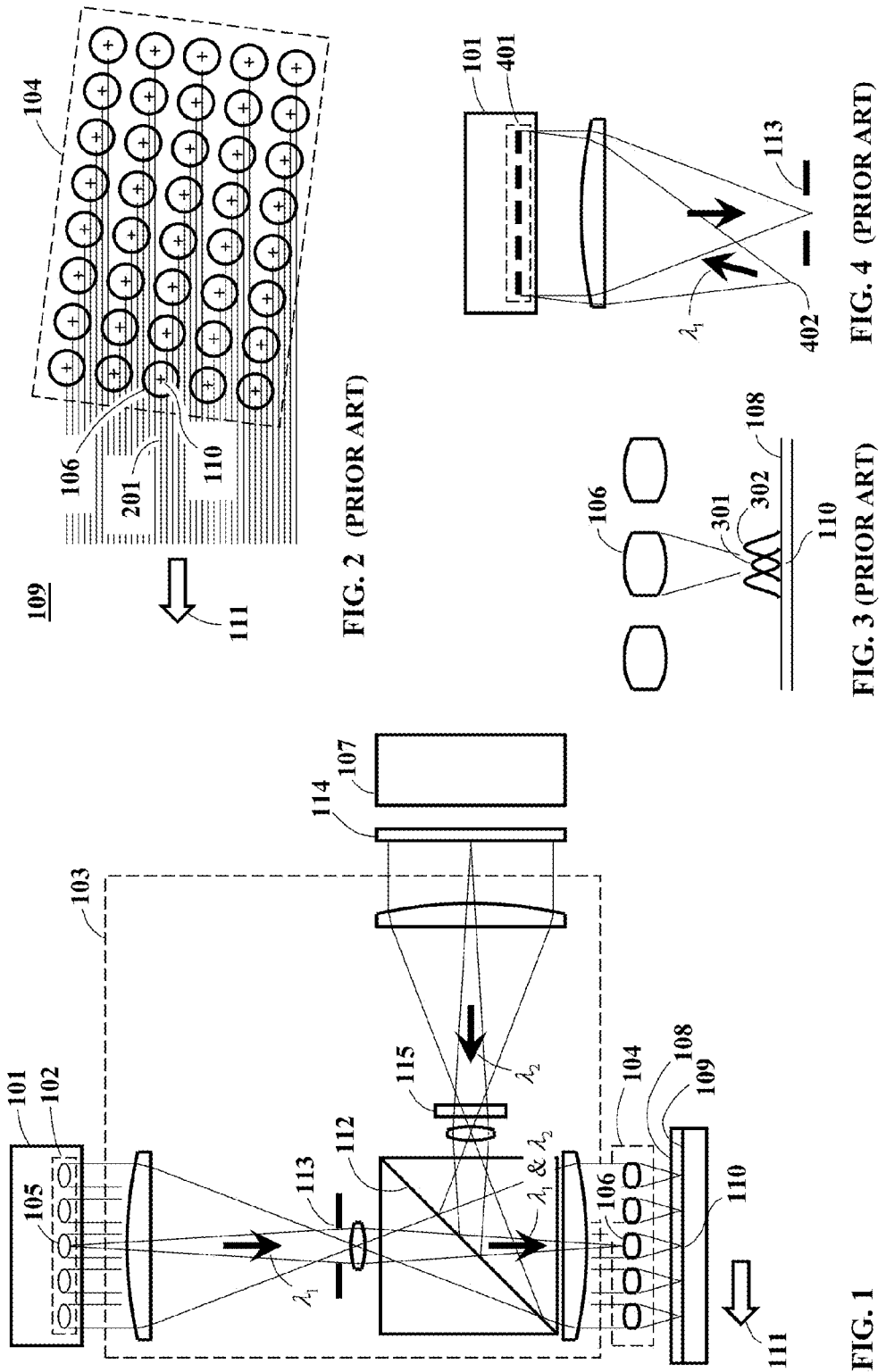

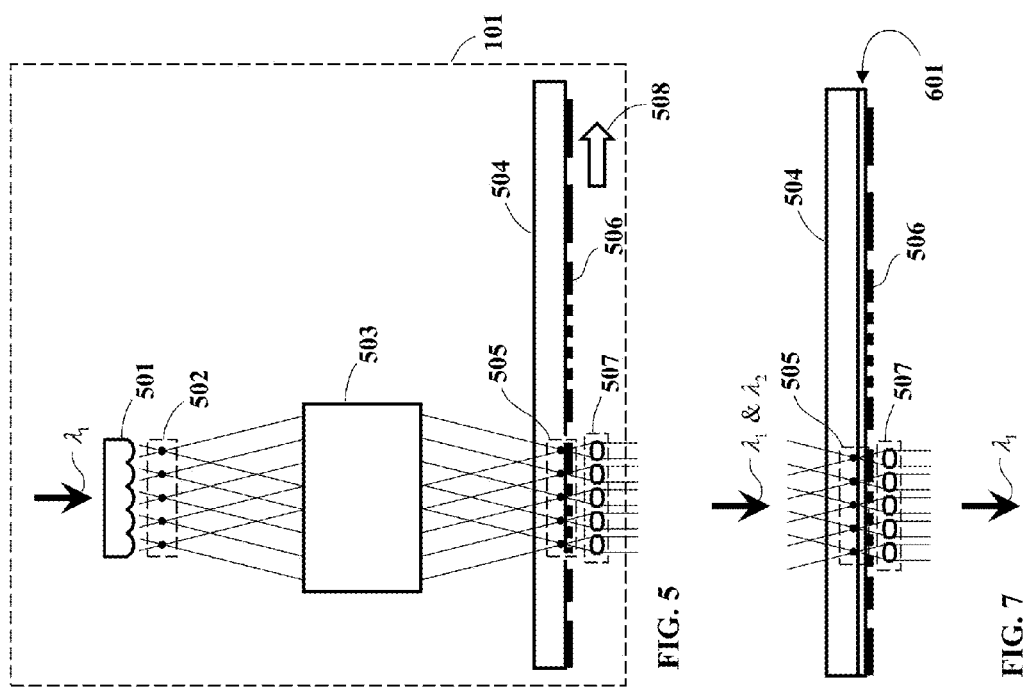
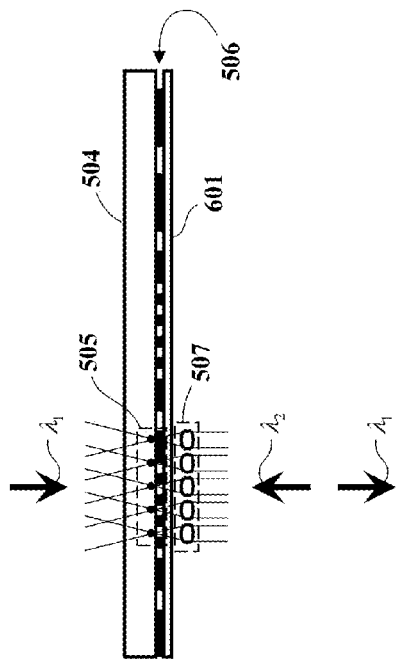
FIG. 6
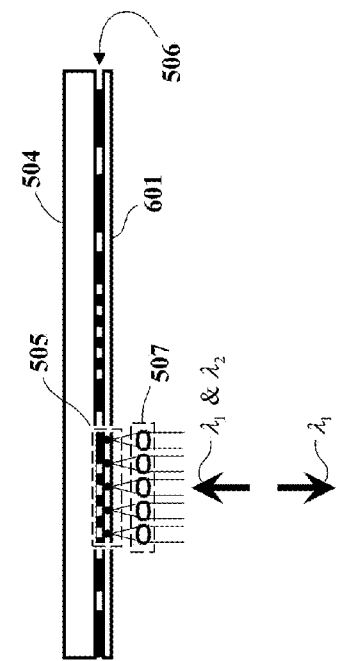
FIG. 8
FIG. 5
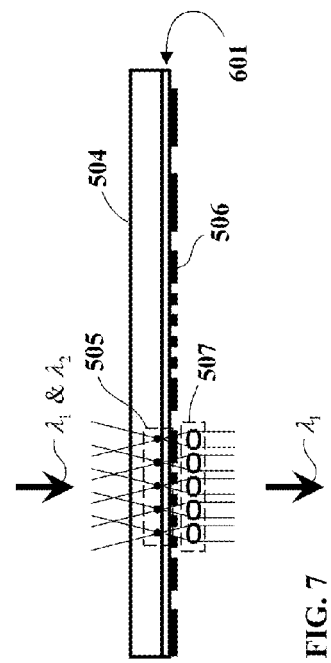
FIG. 7

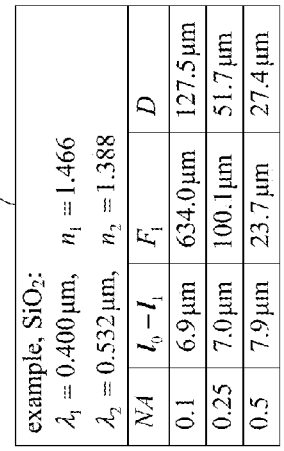

FIG. 13

| | example, SiO₂: $\lambda_1 = 0.400\,\mu m$, $n_1 = 1.466$ $\lambda_2 = 0.532\,\mu m$, $n_2 = 1.388$ | | | |
|---|---|---|---|---|
| NA | $l_0 - l_1$ | $F_1$ | | $D$ |
| 0.1 | 6.9 μm | 634.0 μm | | 127.5 μm |
| 0.25 | 7.0 μm | 100.1 μm | | 51.7 μm |
| 0.5 | 7.9 μm | 23.7 μm | | 27.4 μm |

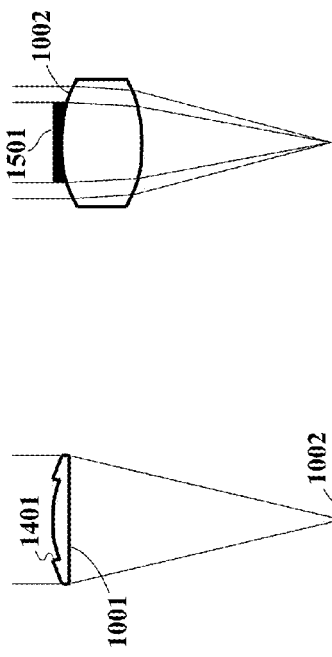

| FIG. 13 | $\lvert (n_1 - n_2)(l_0 - l_1)\rvert = \lambda_2 / \sqrt{1 - NA^2}$ | Eq. 1 |
|---|---|---|
| | $F_1(1/\sqrt{1-NA^2} - 1) \cong (n_1 - 1)(l_0 - l_1)$ | Eq. 2 |
| | $D = 2F_1 NA / \sqrt{1 - NA^2}$ | Eq. 3 |
| FIG. 16 | $(n_1 - 1)h = m_1 \lambda_1$ | Eq. 4 |
| | $(n_2 - 1)h = m_2 \lambda_2$ | Eq. 5 |
| FIG. 17 | $(n_1 - 1)h' = m_1' \lambda_1$ | Eq. 6 |
| | $(n_2 - 1)h' = (m_2' + \tfrac{1}{2})\lambda_2$ | Eq. 7 |
| FIGS. 20, 21 | $\phi_j = 2\pi(n-1)h_j / \lambda$ | Eq. 8 |
| | $2\pi(n_2-1)h_j / \lambda_2 = j\pi/2 + m_{2,j} 2\pi$ | Eq. 9 |
| | $2\pi(n_1-1)h_j / \lambda_1 \cong m_{1,j} 2\pi$ | Eq. 10 |

FIG. 12

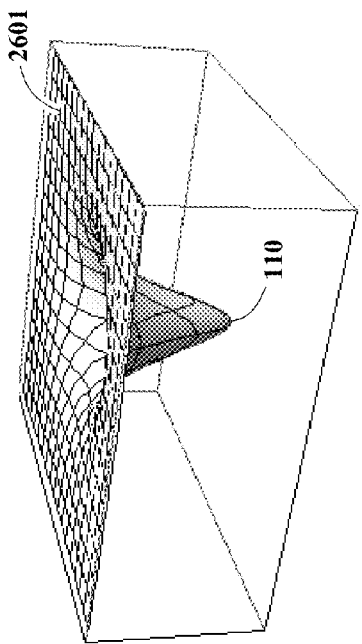
FIG. 24
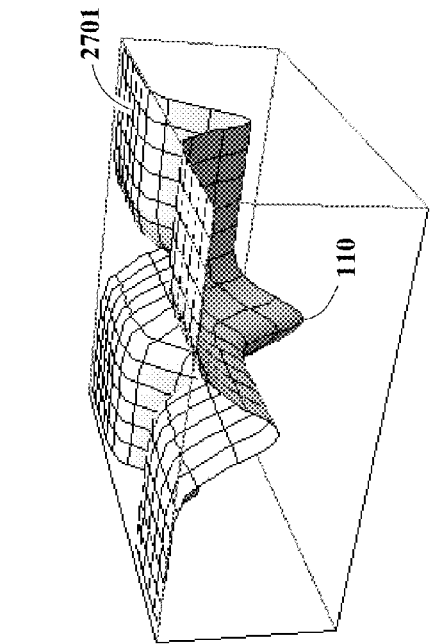
FIG. 26
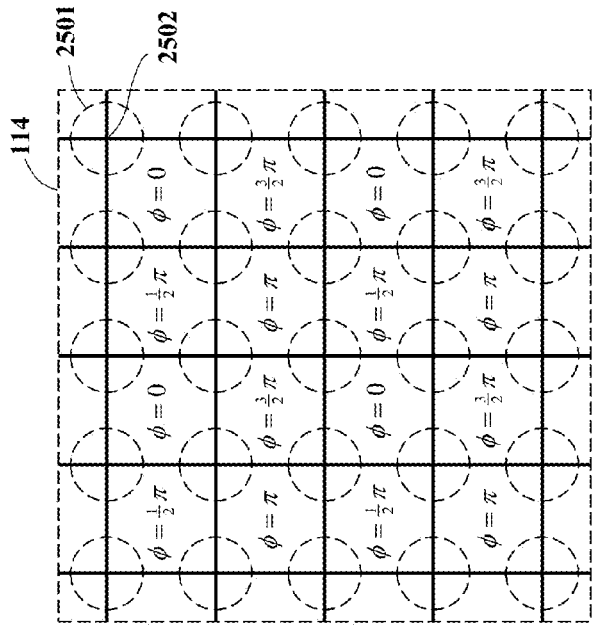
FIG. 25
FIG. 27

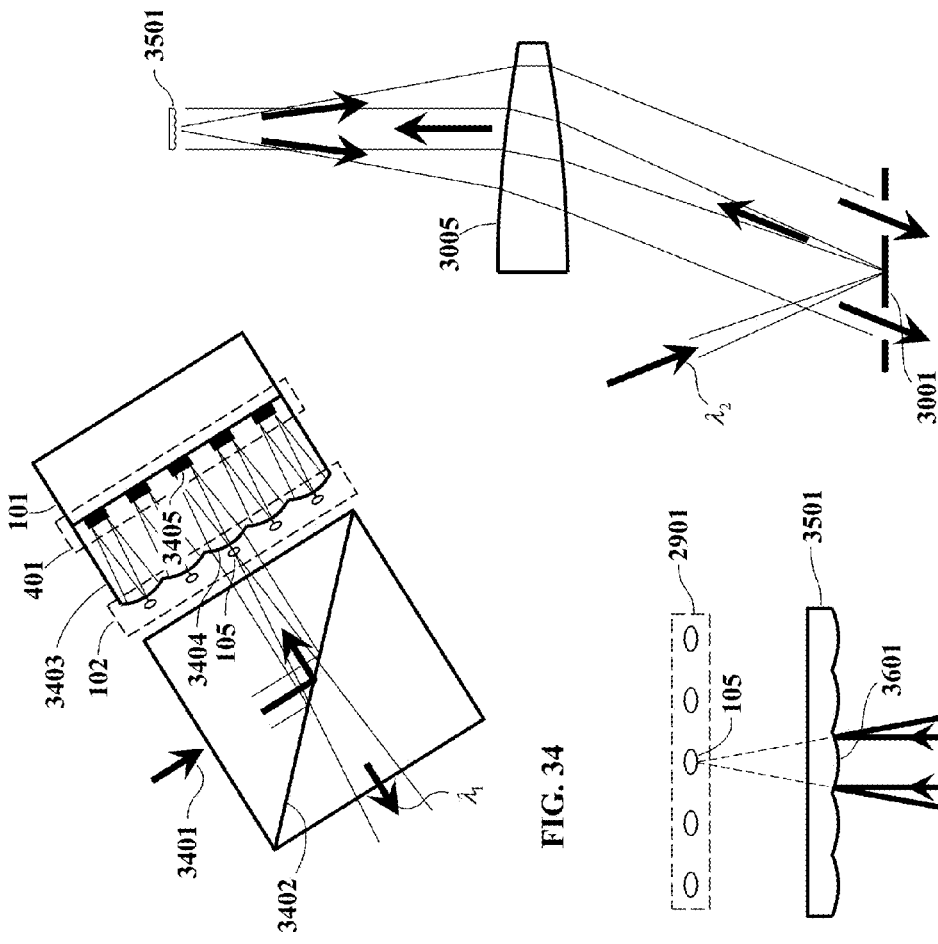
FIG. 34
FIG. 35
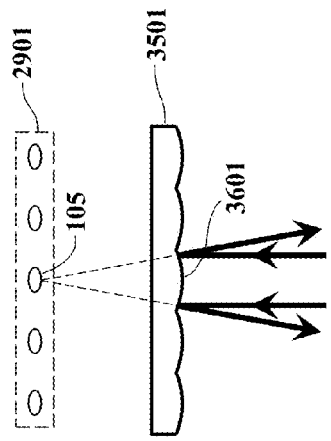
FIG. 36
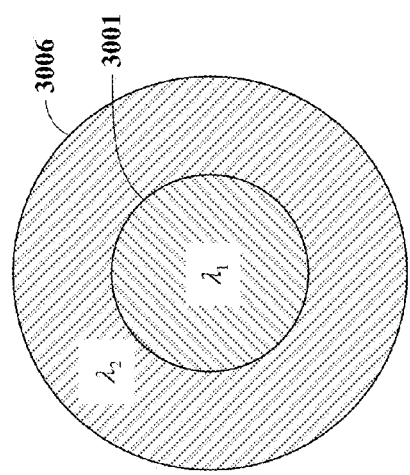
FIG. 32
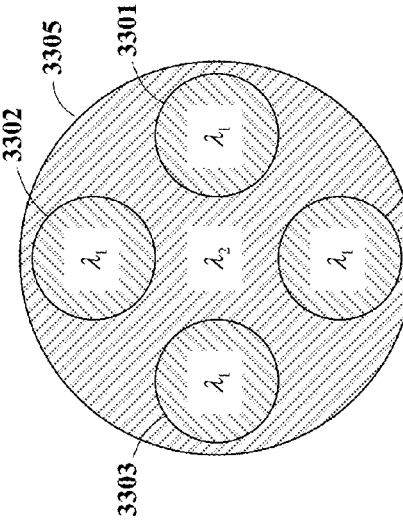
FIG. 33

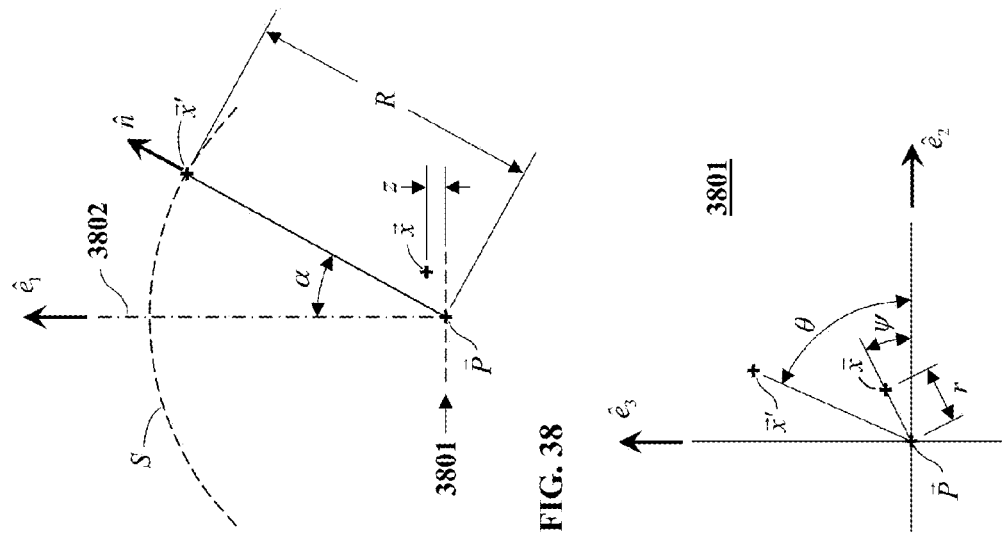
FIG. 38
FIG. 39
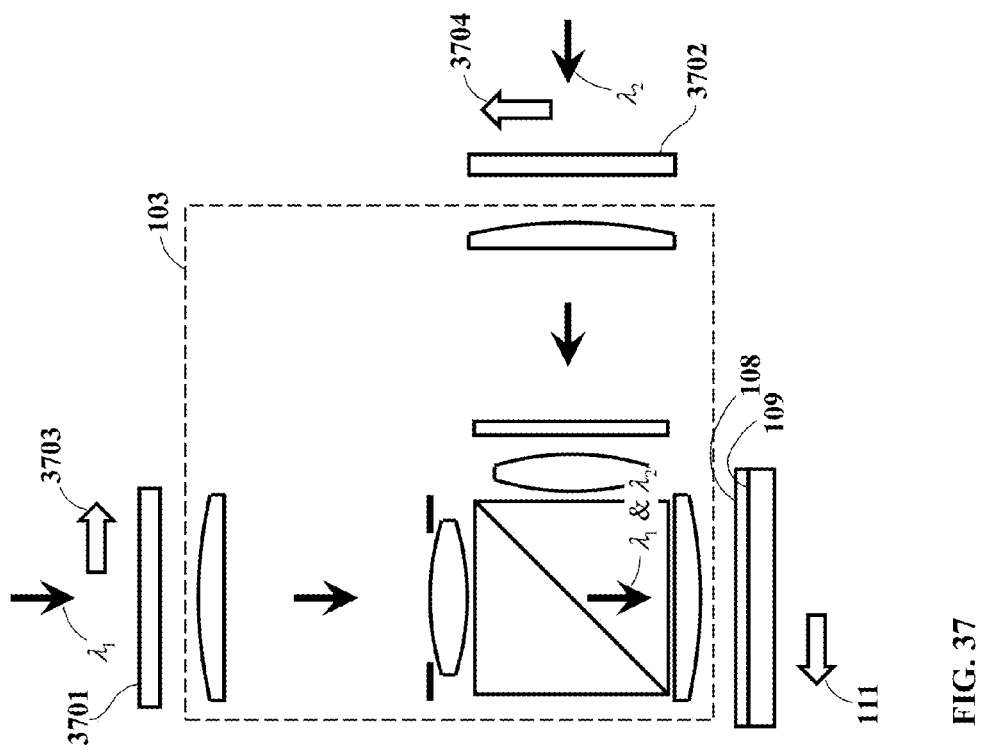
FIG. 37

| | |
|---|---|
| $R = \|\vec{x}' - \vec{P}\|$ | Eq. A1 |
| $\hat{n} = (\vec{x}' - \vec{P})/R$ | Eq. A2 |
| $U[\vec{x}] \propto \iint_S (G[\vec{x} - \vec{x}'] \nabla' U[\vec{x}'] - U[\vec{x}'] \nabla' G[\vec{x} - \vec{x}']) \bullet \hat{n} \, ds$ | Eq. A3 |
| $G[\vec{x} - \vec{x}'] = \dfrac{\exp[i\frac{2\pi}{\lambda}\|\vec{x} - \vec{x}'\|]}{\|\vec{x} - \vec{x}'\|}$ | Eq. A4 |
| $\nabla' G[\vec{x} - \vec{x}'] \cong -i\frac{2\pi}{\lambda}\dfrac{\vec{x} - \vec{x}'}{\|\vec{x} - \vec{x}'\|} G[\vec{x} - \vec{x}']$  $(\|\vec{x} - \vec{x}'\| >> \lambda)$ | Eq. A5 |
| $\|\vec{x} - \vec{x}'\| = \|\vec{x} - \vec{P} - R\hat{n}\| \cong R - (\vec{x} - \vec{P}) \bullet \hat{n}$  $(R >> \|\vec{x} - \vec{P}\|)$ | Eq. A6 |
| $G[\vec{x} - \vec{x}'] \cong \dfrac{\exp[i\frac{2\pi}{\lambda}(R - (\vec{x} - \vec{P}) \bullet \hat{n})]}{R}$  $(R >> \|\vec{x} - \vec{P}\|)$ | Eq. A7 |
| $\nabla' G[\vec{x} - \vec{x}'] \cong i\frac{2\pi}{\lambda}\hat{n} G[\vec{x} - \vec{x}']$  $(R >> \|\vec{x} - \vec{P}\|, R >> \lambda)$ | Eq. A8 |
| $\nabla' U[\vec{x}'] \cong -i\frac{2\pi}{\lambda}\hat{n} U[\vec{x}']$ | Eq. A9 |
| $U[\vec{x}] \propto \iint_S U[\vec{x}'] \exp[-i\frac{2\pi}{\lambda}(\vec{x} - \vec{P}) \bullet \hat{n}] ds$ | Eq. A10 |
| $\vec{x} = \vec{P} + \hat{e}_1 z + (\hat{e}_2 \cos[\psi] + \hat{e}_3 \sin[\psi]) r$ | Eq. A11 |
| $\vec{x}' = \vec{P} + (\hat{e}_1 \cos[\alpha] + (\hat{e}_2 \cos[\theta] + \hat{e}_3 \sin[\theta]) \sin[\alpha]) R$ | Eq. A12 |
| $ds = R^2 \sin[\alpha] d\theta d\alpha$ | Eq. A13 |
| $U[\vec{x}] \propto \iint \left(\int U[\vec{x}'] \exp[-i\frac{2\pi}{\lambda}(z\cos[\alpha] + r\cos[\psi - \theta]\sin[\alpha])] d\theta\right) \sin[\alpha] d\alpha$ | Eq. A14 |
| $\sin[\alpha] \leq NA$ | Eq. A15 |
| $\rho = \sin[\alpha]$ | Eq. A16 |
| $U[\vec{x}'] = A[\rho, \theta]$ | Eq. A17 |
| $U[\vec{x}] = U[z, r, \psi]$ | Eq. A18 |
| $U[z, r, \psi] = \frac{1}{2\pi} \int_{\rho=0}^{NA} \left(\int_{\theta=0}^{2\pi} A[\rho, \theta] \exp[-i\frac{2\pi}{\lambda}(z\sqrt{1-\rho^2} + \rho r \cos[\psi - \theta])] d\theta\right) \dfrac{\rho d\rho}{\sqrt{1-\rho^2}}$ | Eq. A19 |

FIG. 40A

| | |
|---|---|
| $NA = 1$, $A[\rho, \theta] = 1$ $\rightarrow$ $U[0, 0, \psi] = 1$ | Eq. A20 |
| $A[\rho, \theta] = A^{[rad]}[\rho] A^{[az]}[\theta]$ | Eq. A21 |
| $U[z, r, \psi] = \frac{1}{2\pi} \int_{\rho=0}^{NA} \left( \exp[-i\frac{2\pi}{\lambda} z \sqrt{1-\rho^2}] A^{[rad]}[\rho] \int_{\theta=0}^{2\pi} A^{[az]}[\theta] \exp[-i\frac{2\pi}{\lambda} \rho r \cos[\psi - \theta]] d\theta \right) \frac{\rho d\rho}{\sqrt{1-\rho^2}}$ | Eq. A22 |
| $A^{[az]}[\theta] = 1$ $\rightarrow$ $U[z, r, \psi] = U[z, r] = \int_{\rho=0}^{NA} \exp[-i\frac{2\pi}{\lambda} z \sqrt{1-\rho^2}] A^{[rad]}[\rho] J_0[\frac{2\pi}{\lambda} \rho r] \frac{\rho d\rho}{\sqrt{1-\rho^2}}$ | Eq. A23 |
| $A[\rho, \theta] = 1$, $NA \ll 1$ $\rightarrow$ $U[0, r] = \int_{\rho=0}^{NA} J_0[\frac{2\pi}{\lambda} \rho r] \rho d\rho \cong \int_{\rho=0}^{NA} J_0[\frac{2\pi}{\lambda} \rho r] \rho d\rho = NA \frac{J_1[\frac{2\pi}{\lambda} NA r]}{\frac{2\pi}{\lambda} r}$ | Eq. A24 |
| $A[\rho, \theta] = 1$ $\rightarrow$ $U[z, 0] = \int_{\rho=0}^{NA} \exp[-i\frac{2\pi}{\lambda} z \sqrt{1-\rho^2}] \frac{\rho d\rho}{\sqrt{1-\rho^2}} = \frac{\exp[-i\frac{2\pi}{\lambda} z \sqrt{1-NA^2}] - \exp[-i\frac{2\pi}{\lambda} z]}{i\frac{2\pi}{\lambda} z}$ | Eq. A25 |
| $A[\rho, \theta] = 1$, $z = m\lambda/(1-\sqrt{1-NA^2})$ (integer $m$) $\rightarrow$ $U[z, 0] = \begin{cases} 1 - \sqrt{1-NA^2}, & m = 0 \\ 0, & m \neq 0 \end{cases}$ | Eq. A26 |
| $F_2(1/\sqrt{1-NA^2} - 1) = (n_2 - n_1)(I_0 - I_1)$ | Eq. A27 |
| $z = F_2 - F_1$ $\rightarrow$ $(n_2 - n_1)(I_0 - I_1) = z(1/\sqrt{1-NA^2} - 1) = m\lambda/\sqrt{1-NA^2}$ | Eq. A28 |
| $A[\rho, \theta] = 1$, $\exp[-i\frac{2\pi}{\lambda} z \sqrt{1-NA^2}] = \exp[-i\frac{2\pi}{\lambda} z]$, $z \neq 0$ $\rightarrow$ $U[z, r] = \int_{\rho=0}^{NA} \exp[-i\frac{2\pi}{\lambda} z \sqrt{1-\rho^2}] J_0[\frac{2\pi}{\lambda} \rho r] \frac{\rho d\rho}{\sqrt{1-\rho^2}}$ | Eq. A29 |
| $= \exp[-i\frac{2\pi}{\lambda} z] [1 - \sqrt{1-NA^2} + i\frac{\pi}{\lambda} z NA^2] \frac{r^2}{2z^2} + Or^4 \cong \exp[-i\frac{2\pi}{\lambda} z] \frac{i\pi NA^4}{4m\lambda^2} r^2 + Or^4$ | |
| $A^{[rad]}[\rho] = \exp[-a\rho^2 + is\rho^4]$, $NA \ll 1$ $\rightarrow$ $U[z, 0] \cong \int_{\rho=0}^{NA} \exp[-i\frac{2\pi}{\lambda} z(1 - \frac{1}{2}\rho^2)] A^{[rad]}[\rho] \rho d\rho = \exp[-i\frac{2\pi}{\lambda} z] \int_{\rho=0}^{NA} \exp[(iq-a)\rho^2 + is\rho^4] \rho d\rho$ | Eq. A30 |
| $q = \frac{\pi}{\lambda} z$ | Eq. A31 |

FIG. 40B

| | |
|---|---|
| $\int_{\rho=0}^{NA} \exp[(iq-a)\rho^2 + is\rho^4]\rho d\rho$ $\cong \frac{1}{2iq}\left(\left(1-\frac{1}{iq}\left(-a+2is\,NA^2-\frac{2s}{q}\right)\right)\exp[(iq-a)NA^2+is\,NA^4]-\left[1+\frac{1}{iq}\left(a+\frac{2s}{q}\right)\right]\right)$ | Eq. A32 |
| $U[z,0]=0 \rightarrow \left[1-\frac{1}{iq}\left(-a+2is\,NA^2-\frac{2s}{q}\right)\right]\exp[(iq-a)NA^2+is\,NA^4]=\left[1+\frac{1}{iq}\left(a+\frac{2s}{q}\right)\right]$ | Eq. A33 |
| $\sqrt{\left(1-\frac{2s\,NA^2}{q}\right)^2 + \frac{1}{q^2}\left(a+\frac{2s}{q}\right)^2} = \sqrt{1+\frac{1}{q^2}\left(a+\frac{2s}{q}\right)^2}\exp[a\,NA^2]$ | Eq. A34 |
| $a \cong -2s/q$ | Eq. A35 |
| $(1+a\,NA^2)\exp[(iq-a)NA^2+is\,NA^4]=1$ | Eq. A36 |
| $\exp[i(q+s\,NA^2)NA^2]=1$ | Eq. A37 |
| $q = \frac{m2\pi}{NA^2} - s\,NA^2$ (integer $m$) | Eq. A38 |
| $A[\rho,\theta]=1$ for $\rho_0 < \rho < NA$, otherwise 0 $\rightarrow$ | Eq. A39 |
| $U[z,0] = \int_{\rho=\rho_0}^{NA} \exp[-i\frac{2\pi}{\lambda}z\sqrt{1-\rho^2}]\frac{\rho d\rho}{\sqrt{1-\rho^2}} = \frac{\exp[-i\frac{2\pi}{\lambda}z\sqrt{1-\rho_0^2}] - \exp[-i\frac{2\pi}{\lambda}z\sqrt{1-NA^2}]}{i\frac{2\pi}{\lambda}z}$; $z = m\lambda/(\sqrt{1-\rho_0^2} - \sqrt{1-NA^2})$ (integer $m$) $\rightarrow$ | Eq. A40 |
| $A[\rho,\theta]=1$ for $\rho_0 < \rho < NA$, otherwise 0; $U[z,0] = \begin{cases} \sqrt{1-\rho_0^2} - \sqrt{1-NA^2}, & m=0 \\ 0, & m \neq 0 \end{cases}$ | |
| $z = F_2 - F_1 \rightarrow (n_2 - n_1)(l_0 - l_1) = \frac{m\lambda}{\sqrt{1-NA^2}} \frac{1-\sqrt{1-NA^2}}{\sqrt{1-\rho_0^2} - \sqrt{1-NA^2}} \cong \frac{m\lambda}{\sqrt{1-\rho_0^2} - \sqrt{1-NA^2}} \frac{NA^2}{NA^2 - \rho_0^2}$ | Eq. A41 |

FIG. 40C

| | |
|---|---|
| $A[\rho,\theta] = 1$ for $\rho < \rho_0$, and $\exp[i\varphi]$ for $\rho > \rho_0$ $\rightarrow$ <br><br> $U[z,0] = \int_{\rho=0}^{\rho_0} \exp[-i\frac{2\pi}{\lambda}z\sqrt{1-\rho^2}]\frac{\rho d\rho}{\sqrt{1-\rho^2}} + \exp[i\varphi]\int_{\rho=\rho_0}^{NA} \exp[-i\frac{2\pi}{\lambda}z\sqrt{1-\rho^2}]\frac{\rho d\rho}{\sqrt{1-\rho^2}}$ <br><br> $= \dfrac{\exp[-i\frac{2\pi}{\lambda}z\sqrt{1-\rho_0^2}] - \exp[-i\frac{2\pi}{\lambda}z] + \exp[i\varphi]\left(\exp[-i\frac{2\pi}{\lambda}z\sqrt{1-NA^2}] - \exp[-i\frac{2\pi}{\lambda}z\sqrt{1-\rho_0^2}]\right)}{i\frac{2\pi}{\lambda}z}$ | Eq. A42 |
| $A[\rho,\theta] = 1$ for $\rho < \rho_0$, and $\exp[i\varphi]$ for $\rho > \rho_0$ $\rightarrow U[0,0] = \sqrt{1-\rho_0^2} + 1 + \exp[i\varphi]\left(-\sqrt{1-NA^2} + \sqrt{1-\rho_0^2}\right)$ | Eq. A43 |
| $\varphi = (2m+1)\pi$ (integer $m$), $\sqrt{1-\rho_0^2} = \frac{1}{2}(1+\sqrt{1-NA^2})$ $\rightarrow$ $U[0,0] = 0$ in Eq. A43 | Eq. A44 |
| $\int_{\theta=0}^{2\pi} A[\rho,\theta]d\theta = 0$ $\rightarrow$ $U[z,0,\psi] = 0$ | Eq. A45 |
| $A[\rho,\theta] = \exp[i\theta]$ $\rightarrow$ <br><br> $U[0,r,\psi] = \frac{1}{2\pi}\int_{\rho=0}^{NA}\left(\int_{\theta=0}^{2\pi}\exp[i\theta]\exp[-i\frac{2\pi}{\lambda}\rho r\cos[\psi-\theta]]d\theta\right)\frac{\rho d\rho}{\sqrt{1-\rho^2}} = -i\exp[i\psi]\int_{\rho=0}^{NA} J_1[\frac{2\pi}{\lambda}\rho r]\frac{\rho d\rho}{\sqrt{1-\rho^2}}$ <br><br> $= \{\sin^{-1}[NA] - NA\sqrt{1-NA^2}\}\dfrac{-i\pi \exp[i\psi]r}{2\lambda} + Or^2 \cong \dfrac{-i\pi NA^3 \exp[i\psi]r}{3\lambda} + Or^2$ | Eq. A46 |
| $A[\rho,\theta] = \exp[i\phi[\theta]]$; $\phi[\theta] = (\pi/2)\operatorname{floor}[(2/\pi)\theta]$ for $0 \le \theta < 2\pi$ $\rightarrow$ <br><br> $U[0,r,\psi] = \frac{1}{\pi}\int_{\rho=0}^{NA}\left(\int_{\theta=0}^{\pi/2}(\sin[\frac{2\pi}{\lambda}\rho r\sin[\psi-\theta]] - i\sin[\frac{2\pi}{\lambda}\rho r\cos[\psi-\theta]])d\theta\right)\frac{\rho d\rho}{\sqrt{1-\rho^2}}$ <br><br> $= \{\sin^{-1}[NA] - NA\sqrt{1-NA^2}\}\dfrac{-(1+i)\exp[i\psi]r}{\lambda} + Or^2 \cong \dfrac{-2(1+i)NA^3 \exp[i\psi]r}{3\lambda} + Or^2$ | Eq. A47 |

FIG. 40D

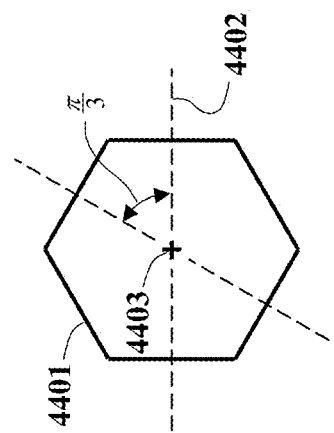

FIG. 44

$$\int \exp[(iq-a)\rho^2 + is\rho^4]\rho d\rho = \frac{1}{2iq}\int \exp[-a\rho^2 + is\rho^4]d\exp[iq\rho^2]$$

$$= \frac{1}{2iq}\left(\exp[(iq-a)\rho^2 + is\rho^4] - \int (-a+2is\rho^2)\exp[(iq-a)\rho^2 + is\rho^4]d\rho^2\right)$$

$$= \frac{1}{2iq}\left(\exp[(iq-a)\rho^2 + is\rho^4] - \frac{1}{iq}\int \exp[-a\rho^2 + is\rho^4]d\left(\left(-a+2is\rho^2 - \frac{2s}{q}\right)\exp[iq\rho^2]\right)\right)$$

$$= \frac{1}{2iq}\left(\exp[(iq-a)\rho^2 + is\rho^4] - \frac{1}{iq}\left(-a+2is\rho^2 - \frac{2s}{q}\right)\exp[(iq-a)\rho^2 + is\rho^4] + \frac{1}{iq}\int \left(-a+2is\rho^2 - \frac{2s}{q}\right)\exp[(iq-a)\rho^2 + is\rho^4]\right)$$

$$\cong \frac{1}{2iq}\left(1 - \frac{1}{iq}\left(-a+2is\rho^2 - \frac{2s}{q}\right)\right)\exp[(iq-a)\rho^2 + is\rho^4]$$

FIG. 41

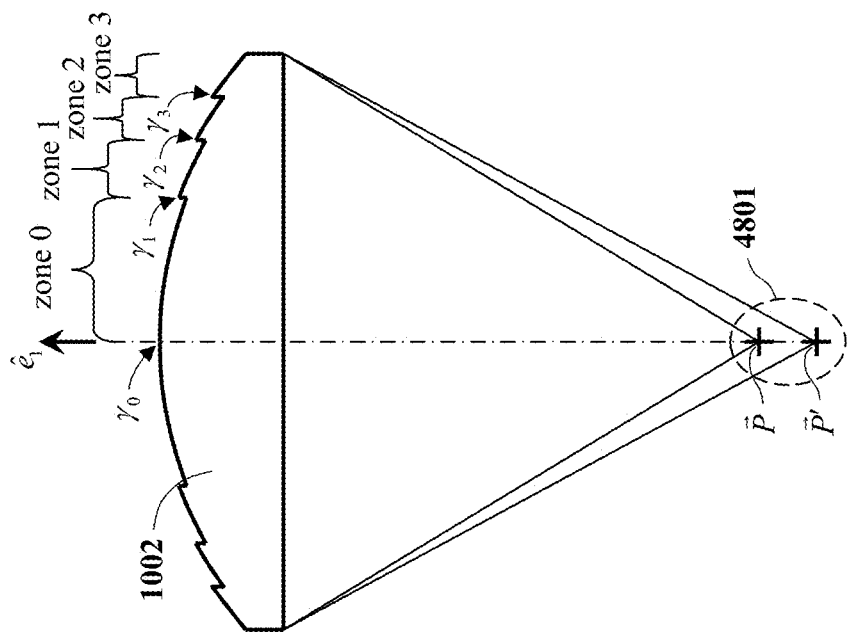

| | |
|---|---|
| $\Phi_1[\bar{x}] = -2\pi|\bar{x}-\bar{P}|/\lambda_1 + const$ in focal region | Eq. B1 |
| $\Phi_2[\bar{x}] = -2\pi|\bar{x}-\bar{P}'|/\lambda_2 + const$ in focal region | Eq. B2 |
| $|\nabla\Phi_1[\bar{x}]| = \begin{cases} 2\pi/\lambda_1 & \text{in air} \\ 2\pi n_1/\lambda_1 & \text{in lens} \end{cases}$ | Eq. B3 |
| $|\nabla\Phi_2[\bar{x}]| = \begin{cases} 2\pi/\lambda_2 & \text{in air} \\ 2\pi n_2/\lambda_2 & \text{in lens} \end{cases}$ | Eq. B4 |
| $\Phi'_1[\bar{x}] = -2\pi \hat{e}_1 \cdot \bar{x}/\lambda_1 + const$ above lens | Eq. B5 |
| $\Phi'_2[\bar{x}] = -2\pi \hat{e}_1 \cdot \bar{x}/\lambda_2 + const$ above lens | Eq. B6 |
| $\Phi_1[\bar{x}] = \Phi'_1[\bar{x}] - m_1 j 2\pi + const$ on $\gamma_j$ (integer $m_1$) | Eq. B7 |
| $\Phi_2[\bar{x}] = \Phi'_2[\bar{x}] - m_2 j 2\pi + const$ on $\gamma_j$ (integer $m_2$) | Eq. B8 |
| $\Phi_1[\bar{x}] = \Phi'_1[\bar{x}] - m_1 j 2\pi + const$ on zone $j$ | Eq. B9 |
| $\Phi_2[\bar{x}] = \Phi'_2[\bar{x}] - m_2 j 2\pi + const$ on zone $j$ | Eq. B10 |
| $b\Phi_1[\bar{x}] + (1-b)\Phi_2[\bar{x}] = b(\Phi'_1[\bar{x}] - m_1 j 2\pi) + (1-b)(\Phi'_2[\bar{x}] - m_2 j 2\pi) + const$ on zone $j$ | Eq. B11 |

OPTICAL SYSTEMS AND METHODS FOR ABSORBANCE MODULATION

CROSS-REFERENCE TO RELATED APPLICATIONS

This application claims priority from the following U.S. patent applications:

1. Provisional Patent Application No. 61/332,694, filed May 7, 2010;
2. Provisional Patent Application No. 61/334,993, filed May 14, 2010;
3. Provisional Patent Application No. 61/360,416, filed Jun. 30, 2010;
4. Provisional Patent Application No. 61/373,784, filed Aug. 13, 2010;
5. Provisional Patent Application No. 61/376,547, filed Aug. 24, 2010;
6. Provisional Patent Application No. 61/381,359, filed Sep. 9, 2010;
7. Provisional Patent Application No. 61/382,871, filed Sep. 14, 2010;
8. Provisional Patent Application No. 61/391,917, filed Oct. 11, 2010; and
9. Provisional Patent Application No. 61/413,867, filed Nov. 15, 2010.

The entire disclosures of all the above-mentioned applications are hereby incorporated by reference for all purposes.

BACKGROUND OF THE INVENTION

The invention relates to absorbance modulation, a method of achieving sub-wavelength optical imaging resolution by forming radiation patterns on a photochromic layer at two wavelengths, an "imaging" wavelength and a "masking" wavelength, wherein the masking wavelength induces optical absorbance (opacity) in the layer so that the imaging wavelength only transmits through narrow optical windows defined by intensity nulls in the masking-wavelength radiation.

The method is primarily applicable to lithography (absorbance modulation optical lithography), in which the transmitted imaging-wavelength radiation exposes a "printing surface" (i.e., a photosensitive recording medium) proximate the photochromic layer. (The "imaging" wavelength can alternatively be termed the "exposure" wavelength in the context of lithography.) This type of system is described by R. Menon and H. I. Smith in "Absorbance-modulation optical lithography," Journal of the Optical Society of America A, Vol. 23, Issue 9, pp. 2290-2294 (2006).

The method is also applicable to microscopy (absorbance modulation optical microscopy), in which the imaging-wavelength radiation interacts with an inspection surface proximate the photochromic layer and is collected by optical detection means to acquire image information about the surface. A system of this type is described by H. Tsai, E. E. Moon, and R. Menon, in "Far-Field Optical Imaging at the Nanoscale via Absorbance Modulation," *Novel Techniques in Microscopy*, OSA Technical Digest (CD) (Optical Society of America, 2009), paper NMA2.

Prior-art absorbance modulation systems typically employ a binary-optic, zone-plate microlens array to concentrate the radiation onto points of a focal-point array proximate the photochromic layer, as described by R. Menon, P. Rogge, and H. Tsai in "Design of diffractive lenses that generate optical nulls without phase singularities," Journal of the Optical Society of America A, Vol. 26, Issue 2, pp. 297-304 (2009). At each focal point a focused-radiation spot at the imaging wavelength is superimposed with an annular-radiation spot at the masking wavelength. Each annular-radiation spot has an optical null at its center, which induces a small, sub-wavelength transmittance window in the photochromic layer through which the imaging-wavelength radiation passes. ("Sub-wavelength" means smaller than the imaging wavelength.) A raster-scanning method is employed to synthesize a full-field lithographic or microscopic image from the focal-point array. In the context of lithography, the focused-radiation spots are modulated by means of a spatial light modulator in a maskless lithography process such as the Zone-Plate Array Lithography (ZPAL) system manufactured by LumArray, Inc. of Somerville, Mass.

Alternative types of microlenses other than binary-optic zone plates can be used for maskless lithography. These include blazed, phase-Fresnel lenses (U.S. Pat. No. 6,960,773) and refractive microlenses (U.S. Pat. No. 6,133,986). However, the use of such alternatives for absorbance modulation does not appear to be practiced in the prior art. Also, more conventional projection optics, which do not employ an image-plane microlens array, have not been adapted for use with absorbance modulation.

SUMMARY OF THE INVENTION

In preferred embodiments of the invention for lithography, radiation patterns at the imaging and masking wavelengths are formed as a focal-point array on a photochromic layer over a printing surface. At each focal point a focused-radiation spot at the imaging wavelength is superimposed with an annular-radiation spot at the masking wavelength. The focal-point array can be generated with a microlens array, in a manner similar to prior-art zone-plate systems, but employing novel types of dual-wavelength microlenses. The focal-point array is raster-scanned across a printing surface proximate the photochromic layer as the imaging-wavelength spots are optically modulated to synthesize a full lithographic image on the surface. A similar system can be used in a microscopy application, wherein the microlenses collect imaging-wavelength radiation from an inspection surface proximate the photochromic layer and an optical detection system senses the radiation collected from each focal point to synthesize a full-field digital image of the surface.

Three types of novel dual-wavelength microlenses are disclosed: First, a simple refracting lens can be configured to produce the desired focused-radiation pattern by taking advantage of the natural chromatic dispersion in the lens. Second, a phase-Fresnel lens can perform a similar function, but without constraining the lens dimensions. Third, a "stepped spiral-phase lens" can be designed for dual wavelength operation, and can produce a much more sharply-focused and localized optical null than is possible with axially-symmetric lens designs.

In a variation of the microlens-array approach, the optical nulls are generated by the combined action of the microlenses and an optical phase-modifying element in the masking-wavelength optical path preceding the microlens array. This approach eliminates the need for dual-wavelength microlenses. The imaging and masking radiation patterns are projected through the microlens array by means of projection optics, which include a beam combiner that merges the two wavelengths from separate optical paths. The phase-modifying element would preferably precede the beam combiner so that it need only be configured to operate at one wavelength.

Taking the projection-optics approach one step further, the focused-radiation spots on the photochromic layer can alternatively be generated by directly imaging them from source spots at the projection optics' object plane, eliminating the need for an image-plane microlens array. A ring-field projection system would preferably be used to achieve good optical imaging performance and to facilitate accommodation of the two optical paths. This type of system could also be adapted for microscopy.

In another embodiment of the invention for lithography applications, the radiation patterns are similarly formed in two separate optical paths, but are formed as full-field images, not as a focal-point array. The images may be generated by photomasks, and the optical nulls in the masking-wavelength pattern would preferably be generated with a phase-shift mask. This embodiment would preferably be implemented using ring-field optics and tandem-scanning photomasks, in a manner similar to conventional step-and-scan projection lithography.

Absorbance modulation techniques can also be applied to optical data storage and retrieval. Data can be written to an optically sensitive recording medium in a manner similar to absorbance modulation optical lithography; and data can be read from an optical storage medium using the principle of absorbance modulation optical microscopy.

A further understanding of the nature and advantages of the present invention may be realized by reference to the remaining portions of the specification and the drawings, which are intended to be exemplary and not limiting.

BRIEF DESCRIPTION OF THE DRAWINGS

FIG. 1 illustrates an absorbance modulation optical lithography system employing projection optics and an image-plane microlens array;

FIG. 2 illustrates the raster scan process employed by a microlens-array system;

FIG. 3 illustrates the focused optical intensity patterns produced by a dual-wavelength microlens at the imaging and masking wavelengths;

FIG. 4 illustrates a portion of a maskless lithography system in which the image source is a spatial light modulator illuminated in reflection mode;

FIG. 5 illustrates a portion of a maskless lithography system in which the image source comprises a backside-illuminated scanning photomask;

FIG. 6 illustrates a scanning-photomask image source employing a photochromic layer with backside illumination by an imaging wavelength and front-side illumination by a masking wavelength;

FIG. 7 illustrates a scanning-photomask image source employing a photochromic layer with backside illumination by both an imaging wavelength and a masking wavelength;

FIG. 8 illustrates a scanning-photomask image source employing a photochromic layer with front-side illumination by both an imaging wavelength and a masking wavelength;

FIG. 12 tabulates equations associated with dual-wavelength microlens designs;

FIG. 13 illustrates a dual-wavelength lens, which takes advantage of the natural chromatic dispersion of a refractive lens;

FIG. 14 illustrates a two-stage compound microlens in which the first-stage lens has a radial phase step configured to optimize the masking wavelength's illumination profile on the second-stage lens;

FIG. 15 illustrates a microlens with a central obscuration;

FIG. 24 tabulates design parameters for an $SiO_2$ four-step spiral-phase plate or lens;

FIG. 25 illustrates a four-step spiral-phase pattern formed on an object-plane phase plate conjugate to an image-plane microlens array;

FIG. 26 illustrates the optical null intensity pattern formed on a microlens focal plane by an aperture phase plate having a continuous spiral-phase pattern;

FIG. 27 illustrates the optical null intensity pattern formed on a microlens focal plane by an aperture phase plate having a four-step spiral-phase pattern;

FIG. 32 illustrates the aperture stop in a ring-field lithography system, showing the aperture division between the imaging and masking wavelengths;

FIG. 33 illustrates an alternative form of aperture division that uses a quadrupole aperture for the imaging wavelength;

FIG. 34 illustrates an image-source apparatus that generates an object-plane array of modulated, radiant-energy source spots at the imaging wavelength;

FIG. 35 illustrates a portion of a ring-field projection system employing a micromirror array for generating an object-plane array of radiant-energy source spots at the masking wavelength;

FIG. 36 illustrates an expanded view of the micromirror array of FIG. 35;

FIG. 37 illustrates an absorbance modulation optical lithography system employing two tandem-scanning, object-plane photomasks to generate the imaging-wavelength and masking-wavelength radiation patterns on the printing surface;

FIGS. 38 and 39 illustrates the integration geometry associated with the Kirchhoff integral;

FIGS. 40A-D and 41 tabulate equations associated with the Kirchhoff integral;

FIG. 44 illustrates a hexagonal-aperture lens;

FIG. 47 tabulates equations associated with a phase-Fresnel lens design; and

FIG. 48 illustrates the cross-sectional geometry of a phase-Fresnel lens design.

DESCRIPTION OF SPECIFIC EMBODIMENTS

Embodiments Using a Microlens Array

Figure 10:
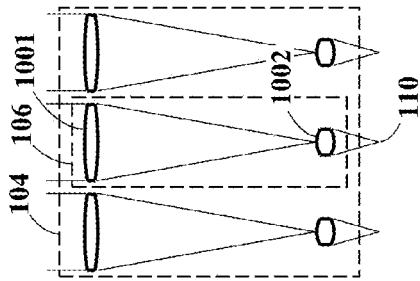
FIG. 10 illustrates a two-stage microlens array.

Microlens scanning systems for both microscopy and lithography are known in the prior art, for example, in U.S. Pat. Nos. 5,900,637 and 6,133,986. Similar systems have been proposed for use with absorbance modulation, using binary-optic zone-plate lenses as the microlens elements. (U.S. Patent Pub. 2010/0097703 A1) FIG. 1 schematically illustrates a lithography system, which is similar to the prior art, except that the microlenses have a novel form differing from the prior-art zone-plate elements. Also, FIG. 1 includes a couple of optional elements, 114 and 115, that have novel utility for absorbance modulation.

An image source 101 in FIG. 1 generates an array 102 of modulated, radiant-energy source spots at a first wavelength $\lambda_1$ (the imaging wavelength) in a $\lambda_1$ object plane of an image projection system 103. The projection system images the $\lambda_1$ source spots 102 onto a microlens array 104 in the projection system's image plane; such that each spot is imaged onto a corresponding microlens (e.g. source spot 105 is imaged onto microlens 106). A radiant-energy source 107 generates radiation at a second wavelength $\lambda_2$ (the masking wavelength), and the projection system merges the $\lambda_1$ and $\lambda_2$ optical paths, so that each microlens receives dual-wavelength radiation. The projection system has an object plane in the $\lambda_1$ optical path (the "$\lambda_1$ object plane") and a separate object plane in the $\lambda_2$ optical path (the "$\lambda_2$ object plane"), both of which are optically conjugate to a common image plane in the common light path. The microlenses focus the $\lambda_1$ radiation onto a photochromic layer 108 deposited on a printing surface 109 (i.e., a photosensitive recording medium). Each microlens focuses the dual-wavelength radiation onto the vicinity of a corresponding focal point proximate (i.e., at or in close proximity to) the photochromic layer. For example, microlens 106 focuses the radiation onto the vicinity of focal point 110. The printing surface is physically modified by exposure to $\lambda_1$ radiation, and the surface is scanned across the focal-point array as the $\lambda_1$ source spots 102 are modulated to print a synthesized, full-field raster image on the surface. (The scan direction is indicated as 111 in FIG. 1.)

The raster scan process is illustrated in FIG. 2. The printing surface 109 is scanned below the microlens array 104 in direction 111, and each microlens focal point traces a raster line on the surface as the image source is modulated (e.g. focal point 110 below microlens 106 traces raster line 201). (In this figure as well as later figures, elements corresponding to those in an earlier figure will generally be denoted by the same reference numeral.) This scan method and a couple of variant methods are described in U.S. Pat. No. 6,133,986. An interleaved raster-scan method described in U.S. Pat. No. 6,498,685 can be used to minimize printing errors due to defects in individual lens elements or image source elements. (See column 34 et seq. and FIG. 35A et seq. in '685.)

With the exception of the $\lambda_2$ optical path and the photochromic layer, the FIG. 1 apparatus is similar to prior-art systems such as that disclosed in U.S. Pat. No. 6,133,986. (See FIG. 2 in '986. The beam splitter 13 in FIG. 2 of '986 is herein indicated as element 112, and is considered to be part of the projection system.) The $\lambda_2$ radiation and photochromic layer operate to improve the system's optical resolution in the manner illustrated in FIG. 3. Each microlens 106 is configured to focus the incident $\lambda_1$ radiation from a corresponding $\lambda_1$ source spot onto a focused-radiation spot on the photochromic layer 108, proximate the microlens's corresponding focal point 110, and to focus the $\lambda_2$ radiation onto an annular-radiation spot, which has a central optical null coinciding with the $\lambda_1$ focused-radiation spot. FIG. 3 schematically illustrates the microlens 106 in cross-section, showing the focal-plane intensity distribution 301 at $\lambda_1$ and the intensity distribution 302 at $\lambda_2$. (Several possible alternative forms of the dual-wavelength microlenses will be described below.) The $\lambda_2$ radiation induces absorbance in the photochromic layer at wavelength $\lambda_1$, and the $\lambda_2$ distribution 302 has an optical null proximate the focal point 110, which opens up a sub-wavelength optical transmittance window in the photochromic layer through which the $\lambda_1$ radiation transmits.

It is not imperative that the $\lambda_1$ focused-radiation spots be focused exactly onto the photochromic layer (i.e. the microlens focal-point array need not be exactly coincident with the photochromic layer), and the spots need not be focused as sharply as possible, because the lithographic printing resolution is determined primarily by the $\lambda_2$-induced transmittance windows, which are overfilled by the $\lambda_1$ focused-radiation spots.

The projection system 103 in FIG. 1 is depicted schematically as a double-telecentric, dioptric system similar to FIG. 2 in U.S. Pat. No. 6,133,986, but catoptric or catadioptric optics could alternatively be employed. The system comprises a beam combiner 112 (illustrated as a dichroic reflector), which merges the $\lambda_1$ and $\lambda_2$ optical paths. (A device such as a dichroic reflector is commonly termed a "beam splitter," although it performs a combining function, rather than splitting, in the present context.) The system has an aperture stop, or "projection aperture," 113 in the $\lambda_1$ optical path. (The projection aperture is illustrated as preceding the beam combiner, but it could be in the common optical path following the beam combiner in alternative embodiments.) If the image source generates well-collimated radiation, then a physical aperture stop may not be required, but the beam waist at the aperture plane would define a virtual projection aperture. The microlens foci (e.g. focus 110) are optically conjugate to the projection aperture.

In some embodiments, the $\lambda_2$ nulls are induced by a null-generating optical element 114 in the $\lambda_2$ optical path, proximate the projection system's $\lambda_2$ object plane. An advantage of this approach is that element 114 is not in the $\lambda_1$ optical path, so it need not be designed for dual-wavelength operation.

Alternatively, a null-generating optical element 115 might be positioned at a position conjugate to the photochromic layer in the $\lambda_2$ optical path (i.e. it is substantially imaged by the microlenses onto the photochromic layer). In this embodiment element 115 is preferably outside of the common $\lambda_1$, $\lambda_2$ optical path between the beam combiner and the microlens array so that only wavelength $\lambda_2$, and not $\lambda_1$, passes through the element.

In alternative embodiments, either element 114 or element 115 could be a reflective component.

The image source 101 in FIG. 1 could be a spatial light modulator (SLM) such as the Digital Micromirror Device (DMD) discussed in U.S. Pat. No. 6,133,986, or the Grating Light Valve (GLV) discussed in U.S. Pat. No. 6,177,980. The DMD and GLV are both front-side-illuminated reflective devices, and some elements of the projection system 103 in FIG. 1 can be used to direct illumination onto the SLM. FIG. 4 schematically illustrates a portion of the FIG. 1 apparatus, in an alternative embodiment, wherein the image source 101 is an SLM comprising an array 401 of reflective pixel elements, which are illuminated from a $\lambda_1$ virtual point source 402 proximate the projection aperture 113. The $\lambda_1$ source spot array 102 in FIG. 1 comprises reflected beams from individual pixel elements, which are individually modulated by controlling the pixels to either reflect $\lambda_1$ radiation into, or deflect the radiation out of, the projection aperture 113. (This embodiment is similar to FIG. 19 in '986.)

In the present context, a "spatial light modulator" can be generally construed as an array of electronically controlled, light-modulating elements ("pixels"). The DMD and GLV modulate light by dynamically varying the pixels' reflective characteristics. Other types of SLMs include variable-transmission devices or devices with self-luminous pixel elements.

Figure 23:
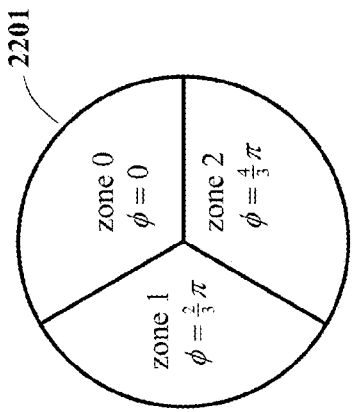
FIG. 23 illustrates the step-induced optical phase shift over the aperture of a three-step spiral-phase plate or lens.

The image source could also comprise a tandem-scanning photomask and object-plane microlens array as illustrated in FIG. 23 of U.S. Pat. No. 6,133,986. (In this embodiment, the image source 101 in FIG. 1 herein would comprise the photomask 78 and microlens array 79 in '986 FIG. 23.) A similar alternative embodiment, which uses backside illumination of the photomask, is illustrated in FIG. 5. $\lambda_1$ radiation is directed onto a microlens array 501, which focuses the radiation through an array of focal points 502. The focal points are imaged by imaging optics 503 through the back side of a transparent photomask substrate 504, and onto a conjugate focal-point array 505 on a mask pattern 506 such as a patterned chrome layer. Another microlens array 507 then recollimates the point-divergent beams transmitting through the chrome mask. The $\lambda_1$ source spot array 102 in FIG. 1 comprises the transmitted beams from individual microlenses in array 507. The spots are modulated by scanning the photomask across the point array 505. (The scan direction is indicated as 508.)

With a photomask image source such as FIG. 5, the projection system 103 in FIG. 1 would typically need to operate at a high demagnification ratio to achieve high image resolution on the printing surface 109. However, high resolution could be achieved even with 1× magnification by adapting the FIG. 5 embodiment to use absorbance modulation. One such approach is illustrated in FIG. 6. The chrome layer 506 is covered by a photochromic layer 601, and the projection system is configured to direct a $\lambda_2$ radiation pattern comprising an array of annular-radiation spots onto the photochromic layer. This limits the photochromic layer's transmittance to narrow transmittance windows at the points of focal-point array 505. In another variant of this approach, illustrated in FIG. 7, the photochromic layer 601 is sandwiched between the substrate 504 and the chrome layer 506, and the $\lambda_1$ and $\lambda_2$ wavelengths are both directed onto the chrome pattern through the substrate. Alternatively, the projection system in the FIG. 6 embodiment could be configured to direct both $\lambda_1$ and $\lambda_2$ radiation through the microlens array 507 and onto the chrome pattern, in reflection mode, and to also collect the reflected $\lambda_1$ radiation, as illustrated in FIG. 8. (This is similar to the front-side illumination system illustrated in FIG. 23 of U.S. Pat. No. 6,133,986.)

Figure 9:
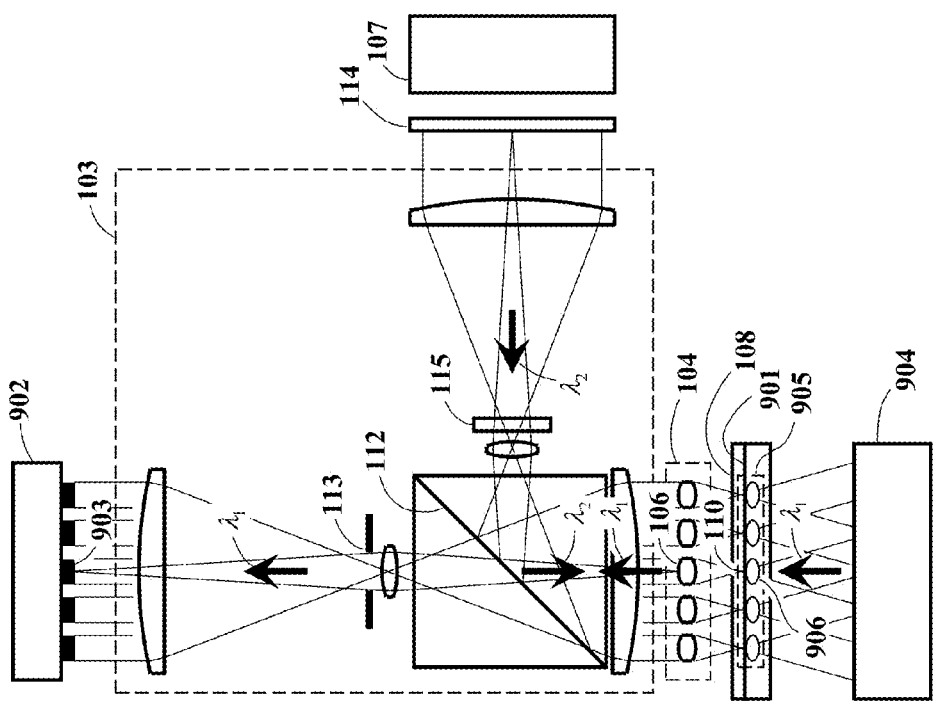
FIG. 9 schematically illustrates an absorbance modulation optical microscopy system employing projection optics and an object-plane microlens array in the imaging-wavelength optical path.

The lithography system illustrated in FIG. 1 can be adapted for transmission microscopy, in the manner illustrated in FIG. 9. This system is similar to FIG. 1, except that the direction of the $\lambda_1$ optical path is reversed, and the $\lambda_1$ object and image planes are interchanged. (In FIG. 9 the microlens array 104 is at the projection system's $\lambda_1$ object plane, which coincides with the $\lambda_2$ image plane.) The microscopy system's projection optics 103 operate to collect $\lambda_1$ radiation that transmits from an inspection surface 901 through an object-plane microlens array 905 and onto an image-plane detector array 902 comprising light-sensing pixel elements such as pixel 903. Each microlens is imaged onto a corresponding detector pixel (e.g. microlens 106 is imaged onto pixel 903), and the imaging optical path transmits through a projection aperture 113, which is optically conjugate to the microlens focal points (such as the focal point 110 of microlens 106). Thus, each detector element senses $\lambda_1$ radiation coming from the vicinity of the corresponding microlens's focal point (e.g. pixel 903 senses radiation from the vicinity of point 110).

A photochromic layer 108 is deposited on the inspection surface, and a $\lambda_1$ illumination source 904 directs radiation through the inspection surface and onto an array 905 of focused-radiation spots on the photochromic layer, proximate the microlens focal points (e.g. focused-radiation spot 906 is concentrated near focal point 110). A $\lambda_2$ radiation pattern comprising annular-radiation spots centered at the $\lambda_1$ focused-radiation spots is projected onto the photochromic layer using the same type of $\lambda_2$ projection system illustrated in FIG. 1. (This system comprises $\lambda_2$ radiation source 107, and optionally, a null-generating element 114 or 115.) The $\lambda_1$ radiation passing from the inspection surface through the photochromic layer is filtered by an array of small transmittance windows at the $\lambda_2$ optical nulls, which are created by $\lambda_2$-induced absorbance of $\lambda_1$ radiation in the photochromic layer.

Element 112 is termed a "beam combiner" in the sense that it merges $\lambda_2$ radiation into the common $\lambda_1$, $\lambda_2$ optical path. But from the perspective of wavelength $\lambda_1$ it actually operates in this context as a "beam splitter," in that it separates $\lambda_1$ radiation out of the common optical path.

The $\lambda_1$ illumination source 904 could have the same form as the photomask illumination system in FIG. 5, with the addition of the photochromic layer and $\lambda_2$ illumination, as illustrated in FIG. 6. In this embodiment, the microlens array 104 in FIG. 9 corresponds to the microlens array 507 in FIGS. 5 and 6, the inspection surface 901 corresponds to the chrome pattern 506, and the photochromic layer 601 corresponds to layer 108. In an alternative approach, the $\lambda_2$ annular-radiation spots could be projected through the back side of the photomask, in the manner of FIG. 7.

The system could also be adapted for reflection microscopy by using the microlenses 104 and portions of the projection optics to direct $\lambda_1$ illumination onto the inspection surface, in the manner of FIG. 8. The $\lambda_1$ optical path for this type of system could resemble FIG. 1 in U.S. Pat. No. 6,133, 986. (The beam splitter 10 in '986 FIG. 1 is herein indicated as element 112, and is considered to be part of the projection system 103.) The absorbance modulation effect would be enhanced in reflection microscopy because the $\lambda_1$ radiation would be filtered by the photochromic transmission windows both before and after intercepting the inspection surface.

The above-described lithography and microscopy systems could alternatively employ a multi-stage microlens array, such as that disclosed in U.S. Pat. No. 6,424,404, rather than the single-stage array 104 illustrated in FIGS. 1 and 9. For example, FIG. 10 illustrates a portion of a two-stage array 104 in which each microlens 106 is a compound lens comprising lens elements 1001 and 1002. The first element 1001 focuses incident radiation onto a diffraction-limited spot substantially filling or overfilling the aperture of the second element 1002, and the second element further focuses the radiation onto focal point 110.

The printing surface 109 in FIG. 1 would typically be a photoresist-coated substrate in a semiconductor lithography application. Rather than depositing the photochromic layer 108 on top of the resist, a possible alternative might be to emulsify the photochromic medium in the resist or in some type of photosensitive material.

Figure 11:
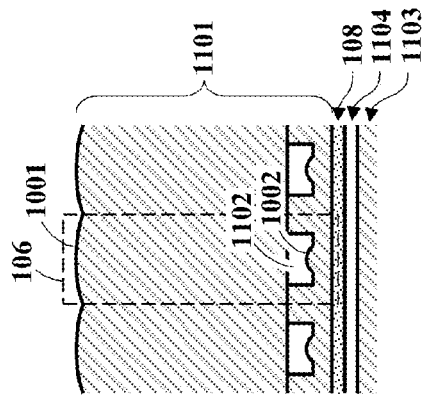
FIG. 11 illustrates a two-stage microlens array forming a superstrate on which a photochromic layer is deposited.

Alternatively, the photochromic layer 108 could be deposited on a superstrate and separated from the workpiece (the printing surface 109 of FIG. 1 or the inspection surface 901 of FIG. 9) by a small air gap. (A similar approach is disclosed in U.S. Patent Pub. 2009/0046299 A1.) The superstrate would incorporate the microlens array. For example, FIG. 11 illustrates a portion of two-stage microlens array in which each compound microlens 106 comprises a first element 1001 formed as a shallow, convex refracting surface on the top of the superstrate 1101, and a second element 1002 embedded within the superstrate. (The space above element 1002 is an empty cavity 1102.) The photochromic layer 108 is deposited on the superstrate and is separated from the workpiece 1103 (the printing surface 109 or inspection surface 901) by a small air gap 1104.

In another embodiment, a fluidic photochromic medium could fill the space between the superstrate and workpiece. (The air gap 1104 in FIG. 11 would be absent and layer 108 would be a fluid.) The photochromic layer would, in effect, function as an immersion fluid in immersion microscopy or immersion lithography.

Following are descriptions of several alternative types of dual-wavelength microlenses that could be used to create the focused-spot pattern illustrated in FIG. 3. The optical theory underlying these lens designs will be outlined in Appendix A. Equations describing quantitative characteristics of these lens forms are tabulated in FIG. 12.

Refractive Lens with Defocus-Induced Optical Null

One way to create a $\lambda_1$ focused-radiation spot coinciding with a $\lambda_2$ optical null is to take advantage of the natural chromatic dispersion of a refractive lens. FIG. 13 shows a cross-sectional view of a axially-symmetric lens element 1002, which focuses incident radiation at wavelength $\lambda_1$ onto a focal point 110. (Element 1002 could be the terminal element of a compound microlens in a multi-stage microlens array 106 such as that illustrated in FIG. 10, or it could simply be a microlens in a single-stage array such as element 106 in FIGS. 1 and 9.) Wavelength $\lambda_2$ is focused to a point 1301, which is axially displaced from the $\lambda_1$ focus 110 due to chromatic dispersion. If the lens size is appropriately chosen, a $\lambda_2$ optical null can be achieved at point 110 as a result of the defocus.

Based on the theory outlined in Appendix A, a null would be achieved under the condition defined by Eq. 1 in FIG. 12, where NA is the lens numerical aperture, $l_0$ and $l_1$ are the optical ray traversal distances through the center and edge of the lens, respectively (cf. FIG. 13), and $n_1$ and $n_2$ are the lens refractive indices at $\lambda_1$ and $\lambda_2$, respectively. The lens focal length $F_1$ (at $\lambda_1$) is determined from the factor $l_0 - l_1$ in Eq. 1 by Eq. 2, and the lens diameter D is defined by Eq. 3. For example, if the lens material is fused silica ($SiO_2$) and the wavelengths are $\lambda_1 = 0.400$ micron and $\lambda_2 = 0.532$ micron, then the conditions tabulated in the inset 1302 in FIG. 13 apply. Several combinations of NA, $l_0 - l_1$, $F_1$, and D are tabulated, based on Eq's. 1-3.

A microlens design that satisfies Eq. 1 will achieve a precise $\lambda_2$ null at the $\lambda_1$ focus, based on some idealized approximations, but in practice the null may be degraded by spherical aberration or radially nonuniform transmittance in the lens. However, the illumination profile on the lens could be controlled to counterbalance and neutralize these factors (as will be further explained in Appendix A). This could be achieved by using an axially-symmetric, two-stage microlens system such as that illustrated in FIG. 14 (cf. FIG. 10). The first-stage lens 1001 has a radial step 1401 in its surface profile (i.e. a discontinuity in the lens surface height as a function of radial distance from the lens axis). The figure shows the inner portion of the surface as being recessed, but the outer portion might alternatively be recessed relative to the inner portion. The step height is chosen to induce a $2 m \pi$ phase discontinuity in the $\lambda_1$ beam (for some integer m), so it has no significant effect on the $\lambda_1$ illumination profile on the second-stage lens 1002. However, it does significantly affect the $\lambda_2$ illumination profile, and the radial position of the discontinuity (and the integer m) are chosen to optimize the $\lambda_2$ illumination to achieve a precise $\lambda_2$ null at the focal point 110. (The same method may be used to optimize the $\lambda_2$ illumination profile on other types of microlens elements such as phase-Fresnel lenses or stepped spiral-phase lenses, which will be discussed below.)

A limitation of the above-described defocus method is that the size of microlens 1002 and its proximity to the focal plane are determined by the choice of lens material, the wavelengths $\lambda_1$ and $\lambda_2$, and the NA according to Eq's. 1-3; but the resulting dimensions may not be very convenient (e.g. in FIG. 13 the condition NA=0.5 implies D=27 micron and $F_1$=24 micron). This constraint could be relaxed by confining the illumination to a peripheral annular zone on lens 1002, e.g., by masking a central portion of the lens with a circular obscuration 1501; see FIG. 15. With this modification, the $\lambda_2$ null condition would be achieved with a larger lens. The lens's linear dimensions would be increased in proportion to the ratio of the full circular aperture area to the unobscured annular aperture area. (This will be demonstrated in Appendix A.) Only the $\lambda_2$ wavelength would need to be obscured over the central area. A dichroic reflective film over the central area could be used to block $\lambda_2$ while transmitting $\lambda_1$.

Phase-Fresnel Lens with Defocus-Induced Optical Null

According to Eqs. 1-3, the dual-wavelength lens's linear dimensions have an inverse proportionate relationship to its chromatic dispersion (i.e., if the refractive index difference $n_1 - n_2$ could be made smaller, then the lens dimensions would be proportionately larger). The dispersion can be effectively reduced by forming the lens element 1002 as a "phase-Fresnel lens" of the form illustrated cross-sectionally in FIG. 16. (The lens would typically be axially symmetric.) One of the lens surfaces is similar to a Fresnel lens, but with the radial steps (such as step 1601) having step heights chosen so that the phase discontinuities at both the $\lambda_1$ and $\lambda_2$ wavelengths are approximately integer multiples of $2\pi$, in the manner of a blazed, circular diffraction grating. If the phase discontinuity for a particular wavelength is $2m\pi$ for some integer m, then the grating structure satisfies the m-th order "blaze" condition and most of the transmitted energy at that wavelength will be concentrated in the m-th diffraction order. The blaze condition cannot generally be achieved exactly for both wavelengths $\lambda_1$ and $\lambda_2$, but it can in some circumstances be close enough to achieve high diffraction efficiency in both wavelengths (possibly in different diffraction orders).

Figure 16:
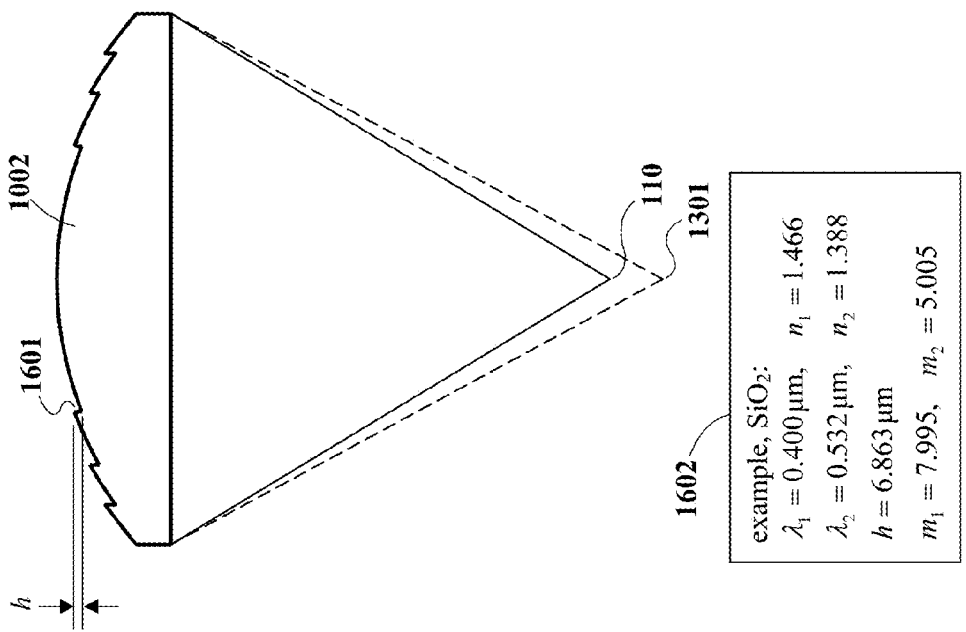
FIG. 16 illustrates a phase-Fresnel lens.

The choice of Fresnel zone radii provides a degree of design freedom that can be used to bring wavelengths $\lambda_1$ and $\lambda_2$ to respective, predetermined focal points 110 and 1301 (cf. FIG. 16). (The energy in the blaze diffraction orders would be focused at these points, but some energy would typically be lost into other diffraction orders.) The locations of the two focal points can be chosen independently of the lens dimensions, and the offset between the points can be determined so that $\lambda_2$ exhibits a defocus null at $\lambda_1$ focal point 110.

The above-described simultaneous blazing condition for wavelengths $\lambda_1$ and $\lambda_2$ is defined (in a paraxial approximation) by Eq's. 4 and 5 (FIG. 12), where h is the step height (FIG. 16), and $m_1$ and $m_2$ are integers (the blaze orders for $\lambda_1$ and $\lambda_2$, respectively). For example, using wavelengths $\lambda_1=0.400$ micron and $\lambda_2=0.532$ micron and $SiO_2$ refractive indices $n_1$ and $n_2$, and choosing a step height of h=6.863 micron, Eq's. 4 and 5 imply $m_1=7.995$, $m_2=5.005$ (see FIG. 16 inset 1602). These numbers are nearly integer-valued, indicating that near-perfect blazing can be simultaneously achieved for both wavelengths, with blaze orders 8 and 5 for $\lambda_1$ and $\lambda_2$, respectively.

Phase-Fresnel lens designs are described in more detail in Appendix B. The above-described lens design is axially symmetric and has radial phase steps. ("Radial" means constant-radius, i.e. circular, steps.) However, the design methodology described in Appendix B is not limited to axially-symmetric lens forms, and the phase steps could generally have a non-circular (e.g., elliptical) form. Thus, the characterization of a phase-Fresnel lens as having the form of a blazed, "circular" diffraction grating is overly limiting—the grating zones may be non-circular. The description of the element as a "lens" generally implies curved grating zones having focusing power.

Phase-Fresnel Lens with Dephasing-Induced Optical Null

Figure 17:
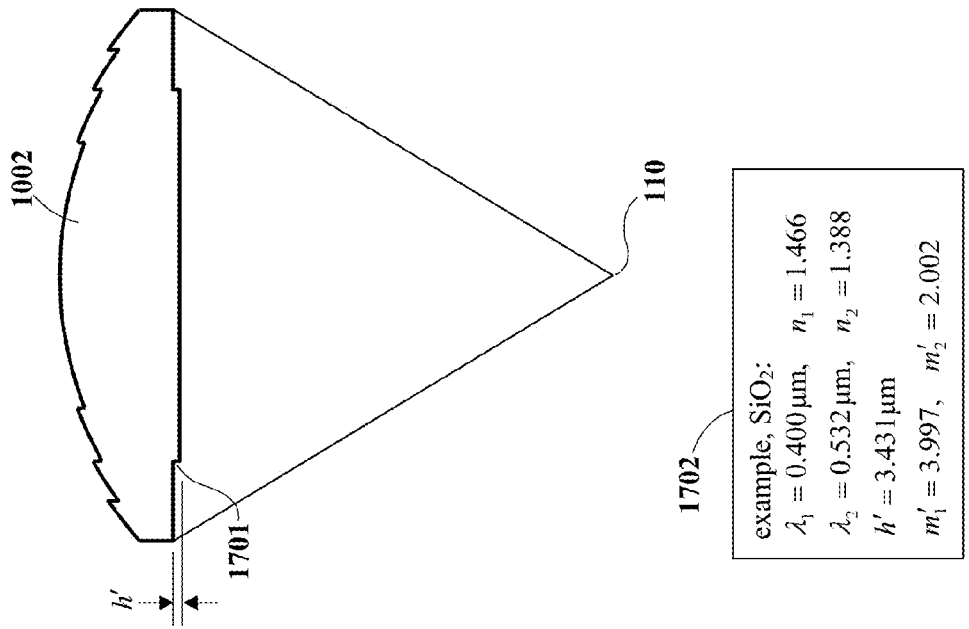
FIG. 17 illustrates a phase-Fresnel lens with a radial phase step, which induces an optical null at the masking wavelength.

The dual-wavelength lens designs described above use a defocusing method to achieve a $\lambda_2$ null. An alternative approach, based on a dephasing technique, is illustrated in FIG. 17. This lens design is similar to the phase-Fresnel lens of FIG. 16, but with two differences: First, the Fresnel zone structure on the lens 1002 is designed to bring both wavelengths to a common geometric focus at point 110 (no defocus). Second, an additional radial phase step 1701 (a "dephasing step") is designed into one of the lens surfaces to induce a phase shift of approximately $m_1'2\pi$ at wavelength $\lambda_1$, and $(m_2'+\frac{1}{2})2\pi$ at wavelength $\lambda_2$, where $m_1'$ and $m_2'$ are integers. These conditions are shown in FIG. 12 as Eq's. 6-7, in a paraxial approximation, where h' is the step height (FIG. 17). The radial position of the step is chosen so that it divides the lens clear aperture into two zones of approximately equal area. For clarity of illustration, FIG. 17 shows an embodiment in which the step is on the lens surface opposite the Fresnel surface, but it would more practically be superimposed on the Fresnel surface, and the design would be configured so that the dephasing step coincides with one of the Fresnel zone steps.

The dephasing step converts the $\lambda_2$ focused-radiation spot at point 110 into a null, while preserving the focused-radiation spot at $\lambda_1$. For the same wavelength and material parameters assumed in FIG. 16, a step-height choice of h'=3.431 micron in FIG. 17 yields $m_1'=3.997$, $m_2'=2.002$ from Eq's. 6-7 (see inset 1702 in FIG. 17). The near-integer values indicate that the dephasing condition can be achieved almost perfectly for the assumed conditions.

Appendix A describes a variation of the FIG. 17 lens that does not require a phase-Fresnel lens; it only requires the phase step 1701 to achieve a $\lambda_2$ null at the $\lambda_1$ geometric focus, taking into account refractive index dispersion in the lens.

The radial position of the phase step and the step height provide two degrees of freedom that can be used to make both the real and imaginary parts of the $\lambda_2$ zero at any predetermined focal position. However, a sharper and more localized null can be achieved if a phase-Fresnel surface is used to bring the $\lambda_1$ and $\lambda_2$ geometric foci into coincidence. On the other hand, the phase-Fresnel surface could be advantageously configured to induce a small focus offset between $\lambda_1$ and $\lambda_2$ so that the optimal null-producing phase step for $\lambda_2$ has no dephasing effect on $\lambda_1$ (i.e., $m_1'$ and $m_2'$ are both exact integers in Eq's. 6-7).

The surface geometry of a dephasing lens is determined so that the two zones defined by the phase step both direct incident $\lambda_1$ radiation toward a common $\lambda_1$ geometric focus, and also both direct incident $\lambda_2$ radiation from the two zones toward a common $\lambda_2$ geometric focus coinciding with or proximate the $\lambda_1$ focus. For a simple refracting surface, the geometric foci can be defined by ray tracing. If a phase-Fresnel surface is used, the geometric foci can be defined by spatially-distributed phase functions of the type described in Appendix B. (The constant-phase loci of the phase functions represent geometric wavefronts.) The location and height of the dephasing step are chosen to achieve a $\lambda_2$ optical null at the $\lambda_1$ focus by dephasing (i.e., inducing destructive interference between) portions of the convergent $\lambda_2$ beam transmitting through the two zones; but the design conditions are also chosen to maintain phase coherence (i.e., constructive interference) between similar portions of the convergent $\lambda_1$ beam. (Some loss of $\lambda_1$ phase coherence can be tolerated; it is more important that precise $\lambda_2$ dephasing be achieved to form an optical null.)

The phase-Fresnel lens forms illustrated in FIGS. 16 and 17 are a variety of diffractive lens. An alternative type of prior-art diffractive lens that is useful for absorbance modulation is disclosed in U.S. Patent Pub. 2010/097703 A1. (See also R. Menon, P. Rogge, and H. Tsai, "Design of diffractive lenses that generate optical nulls without phase singularities," Journal of the Optical Society of America A, Vol. 26, 297-304 (2009).) The patent discloses a "dichromatic lens" comprising a plurality of concentric, annular zones, wherein the lens surface height varies between zones but not within zones. Only binary-phase structures comprising two height levels are disclosed (cf. EQ. 1 in '703.). Such structures can be easily manufactured, but binary-phase structures are overly constraining because the grating structure is required to provide all of the optical power in the lens, whereas the phase-Fresnel lens divides the optical power between the grating and the underlying refractive surface. Also, the surface curvature within the Fresnel zones has the effect of blazing the grating to achieve an optimal null at wavelength $\lambda_2$ and high focal-point intensity at wavelength $\lambda_1$.

Phase-Fresnel lenses have been proposed for use in maskless lithography (U.S. Pat. No. 6,960,773), but not for dual-wavelength use in the manner described above.

Spiral-Phase Lens

The lens forms described above are generally axially symmetric. An alternative type of prior-art, null-producing lens is a "spiral zone plate," which is not axially symmetric. (H-Y. Tsai, H. I. Smith, and R. Menon, "Fabrication of spiral-phase diffractive elements using scanning-electron beam-lithography," J. Vac. Sci. Technol. B 25, pp. 2068-2071 (2007).) Also, a "spiral-phase plate" can be used in series with either a conventional refractive lens or a zone-plate lens to create an optical null. (T. Watanabe, M. Fujii, Y. Watanabe, N. Toyoma, and Y. Iketaki, "Generation of a doughnut-shaped beam with a spiral phase plate," Rev. Sci. Instrum. 75, 5131-5135 (2004).) A spiral-phase pattern can be formed directly on the surface of a refractive lens. A focusing device that includes a spiral-phase element will herein be generically termed a "spiral-phase lens". (The term "vortex lens" is also commonly applied to such structures.)

A spiral-phase lens generates an axial null by imposing an azimuth-proportionate phase shift in the lens aperture. An advantage of a spiral-phase lens is that the null extends along the entire lens axis; it does not occur only at discrete axial points as it does with an axially-symmetric lens. A further advantage of a spiral-phase lens is that the electromagnetic field amplitude near the lens axis is approximately proportional to the first power of the radial distance r from the lens axis. By contrast, axially symmetric lenses have the property that the focal-plane field amplitude is an even function of r, and hence the amplitude in the vicinity of an axial null is approximately proportional to $r^2$ for small r. Consequently, the optical null produced by an axially symmetric lens would not be nearly as sharp or localized as that of a spiral-phase lens.

Figure 18:
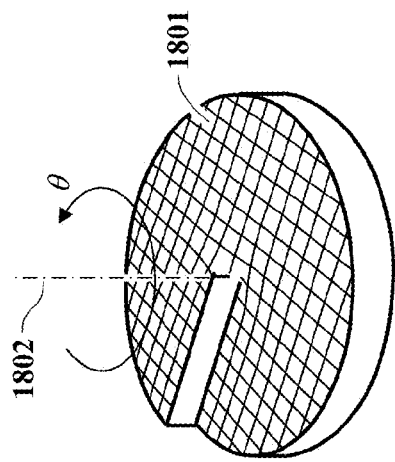
FIG. 18 illustrates a continuous spiral-phase plate.

FIG. 18 illustrates a spiral-phase plate 1801. The top surface height is a linear function of the azimuthal angle θ around an optical axis 1802, and the height variation induces a phase shift in a transmitted beam equal to θ at a particular design wavelength.

Figure 19:
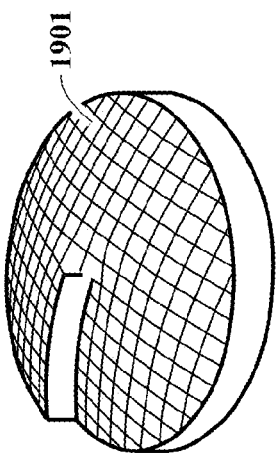
FIG. 19 illustrates a continuous spiral-phase lens.

FIG. 19 illustrates a spiral-phase lens 1901, which is similar to a conventional axially-symmetric refractive lens except that an azimuthal height gradient is superimposed on the lens. Again, the azimuthal height variation induces a phase shift in a transmitted beam equal to the azimuth angle.

The prior-art spiral-phase lens described above is only designed for single-wavelength use. It would not be useful in an absorbance modulation application in which the lens needs to transmit two wavelengths, $\lambda_1$ and $\lambda_2$ to generate a highly-resolved focused-radiation spot at $\lambda_1$ coinciding with an optical null at $\lambda_2$. However, a modified lens form, which can be described as a "stepped spiral-phase lens" could be adapted for dual-wavelength operation. The lens aperture is partitioned into a number of wedge-shaped azimuthal zones, and the continuous, spiral-phase function is replaced by a step function of θ, which is constant in each zone. (The above-noted Watanabe reference describes an eight-step spiral-phase lens, but it is not configured for dual-wavelength use in the manner described herein.)

Figure 20:
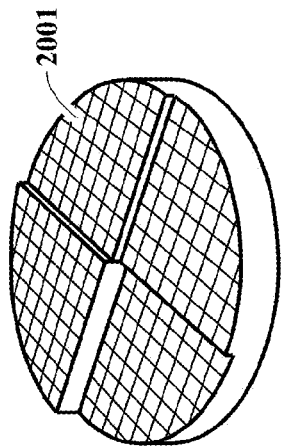
FIG. 20 illustrates a stepped spiral-phase plate.
Figure 21:
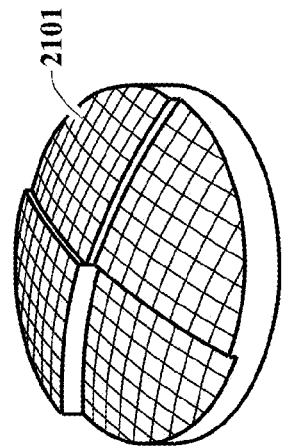
FIG. 21 illustrates a stepped spiral-phase lens.

The stepped spiral-phase pattern can be formed directly on the surface of a lens, or it could be formed on a phase plate separate from the lens. FIG. 20 illustrates a "stepped spiral-phase plate" 2001, which is similar to the continuous spiral-phase plate of FIG. 18 except that the phase function is discretized in four azimuthal zones, each covering π/2 azimuthal range. FIG. 21 illustrates a similar "stepped spiral-phase lens" 2101, which has the phase pattern formed directly in the lens surface. (A similar stepped spiral-phase function could be incorporated in a bi-level zone plate lens by simply altering the diffractive zones' radii between azimuthal zones. No additional surface levels would be required.)

Figure 22:
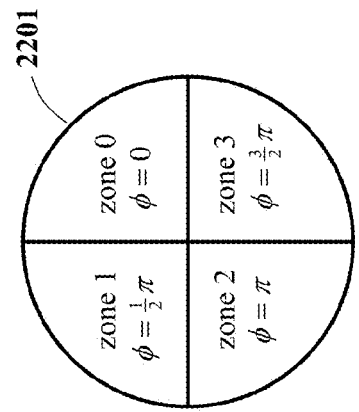
FIG. 22 illustrates the step-induced optical phase shift over the aperture of a four-step spiral-phase plate or lens.

The designs illustrated in FIGS. 20 and 21 can be described as a "four-step" spiral-phase plate or lens, based on the number of azimuthal zones. FIG. 22 is a plan view of the lens aperture 2201, showing the four zones (labeled "zone 0" . . . "zone 3") and the optical phase shift ϕ in each zone relative to zone 0. The phase shift ϕ on zone j is ϕ=jπ/2.

Other zone numbers could alternatively be used; for example, the "three-step" spiral-phase pattern illustrated in FIG. 23 comprises three azimuthal zones, each covering a 2π/3 azimuthal range. For this pattern the phase shift in zone j is ϕ=j2π/3. (At least three zones would be required to achieve an optical null localized on the lens axis.)

In the context of absorbance modulation, FIGS. 22 and 23 represent the phase shifts at wavelength $\lambda_2$. To effect these phase shifts without significantly degrading the focus at wavelength $\lambda_1$, integer multiples of 2π can be added to the $\lambda_2$ phase shifts, such that each zone's phase shift at $\lambda_1$ is close to a whole multiple of 2π.

This technique can be illustrated with the four-step design of FIGS. 20 and 21. The surface height offset of zone j relative to zone 0, denoted $h_j$, determines the phase shift $\phi_j$ in zone j according to Eq. 8 in FIG. 12, where λ is the wavelength and n is the lens refractive index. (This relation applies to the stepped spiral-phase plate of FIG. 20, and it is a paraxial approximation for the stepped spiral-phase lens of FIG. 21.) For the four-step design, $\phi_j$ should be $j\pi/2 + m_{2,j}2\pi$ at wavelength $\lambda_2$ for some integer $m_{2,j}$, as indicated in Eq. 9, where $n_2$ is the lens refractive index at wavelength $\lambda_2$. At wavelength $\lambda_1$, $\phi_j$ should be approximately equal to $m_{1,j}2\pi$ for some integer $m_{1,j}$, as indicated in Eq. 10, where $n_1$ is the lens refractive index at wavelength $\lambda_1$.

For example, FIG. 24 tabulates design parameters for an $SiO_2$ four-step lens having the form of FIG. 21 with wavelengths $\lambda_1$=0.400 micron and $\lambda_2$=0.532 micron. The four step heights $h_0$, $h_1$, $h_2$, and $h_3$, relative to zone 0, are 0, 1.714, 3.428, and 5.142 micron, respectively. These heights are chosen to give exact integer values for $m_{2,j}$ in Eq. 9. ($m_{2,0}$, $m_{2,1}$, $m_{2,2}$, and $m_{2,3}$ are 0, 1, 2, and 3, respectively.) The resulting $m_{1,j}$ values, calculated from Eq. 10, are very nearly integer-valued. ($m_{1,0}$, $m_{1,1}$, $m_{1,2}$, and $m_{1,3}$ very close to 0, 2, 4, and 6, respectively.)

A stepped spiral-phase pattern such as that defined in FIG. 24 could alternatively be formed on a dispersion-compensating phase-Fresnel form such as that illustrated in FIG. 16, in order to achieve both a sharp focus at $\lambda_1$ and a small optical null at $\lambda_2$. The phase-Fresnel structure would be configured to bring both wavelengths $\lambda_1$ and $\lambda_2$ to a common geometric focus 110, and the $\lambda_2$ null would be induced by the stepped spiral-phase pattern, not by defocus or by the dephasing step illustrated in FIG. 17. The lens's top-surface height distribution would be the sum of two functions, a radially-dependent phase-Fresnel profile, and an azimuthally-dependent, stepped spiral profile. Alternatively, the stepped spiral-phase pattern could be formed on the planar surface of a plano-convex lens such as that illustrated in FIG. 16; or it could be formed on a separate phase plate in series with a phase-Fresnel lens.

A stepped spiral-phase lens employs an operational principle of dephasing similar to that of the previously-described dephasing lens (FIG. 17), except that it uses more than two phase levels and the phase steps are typically azimuthal, i.e., in constant-azimuth planes (although the steps need not be strictly limited to a constant-azimuth form). The spiral-phase surface can be generically described as a type of "dephasing" surface, in that a $\lambda_2$ null is achieved by means of dephasing (i.e. destructive interference) between portions of the $\lambda_2$ beam transmitting through the surface zones defined by the phase steps. The two forms of dephasing can be distinguished as "radial dephasing" (for axisymmetric lenses such as FIG. 17) or "azimuthal dephasing" (for stepped spiral-phase lenses).

The generic defining characteristic of a spiral-phase lens is that it has an optical axis, and it is configured so that for incident radiation of a particular wavelength directed along the axial direction, the dephasing surface's azimuthally-averaged complex amplitude transmittance around the lens axis is zero. This implies that a dephasing null is achieved along the entire lens axis following the dephasing surface. (The defining characteristic will be described more formally in Appendix A.)

The surface geometry of a stepped spiral-phase lens is determined by a process similar to that of a dephasing lens. The zones are individually configured so that they all direct incident $\lambda_1$ radiation toward a common $\lambda_1$ geometric focus, and so they also all direct incident $\lambda_2$ radiation toward a common $\lambda_2$ geometric focus coinciding with or proximate the $\lambda_1$ focus. (Ray tracing can be used to design simple refracting surfaces, and the phase-matching method described in Appendix B can be used to design phase-Fresnel surfaces.) The locations and heights of the phase steps are chosen to make the lens's azimuthally-averaged complex amplitude transmittance equal to zero at wavelength $\lambda_2$ but to preserve a high degree of azimuthal phase coherence (i.e., constructive interference) between the zones at wavelength $\lambda_1$.

Object-Plane Phase Plate (or Phase Mirror)

The $m_{1,j}$ factors in FIG. 24 are nearly integer-valued (according to Eq. 10) due to the fortuitous choice of wavelengths and refractive indices. For some wavelength and refractive index combinations it may not be possible to construct a stepped spiral-phase lens for dual-wavelength use that achieves a precise null at $\lambda_2$ while still preserving a well-resolved $\lambda_1$ focus. Furthermore, fabricating the stepped spiral structure on microlenses may be problematic. For these reasons, an alternative technique could be employed in which the null-generating phase pattern is not formed directly on the microlenses, but is rather imaged through projection optics onto the microlenses.

The spiral-phase pattern can be created by transmitting the $\lambda_2$ radiation through, or reflecting it off of, a phase-modifying surface, which is proximate an object plane that is conjugate to the microlens array. For example, element 114 in FIG. 1 or FIG. 9 could be a phase plate (or in alternative embodiments, a phase mirror), which is imaged onto the microlens array 104 and imposes a four-step spiral-phase pattern on each microlens. A portion of element 114 in this embodiment is illustrated in plan view in FIG. 25. The surface has a stepped height profile comprising four height levels, which impose four corresponding phase shifts on the transmitted $\lambda_2$ radiation. (A similar phase pattern could alternatively be created in a reflective surface, i.e. a "phase mirror".) The constant-height zones form a periodic, rectangular grid in which each 2-by-2 group of adjacent rectangles forms a unit cell of the periodic pattern. The phase shifts $\phi$ in each 2-by-2 group take on the values $0$, $\pi/2$, $\pi$, and $3\pi/2$, in cyclic order as in FIG. 22. The image conjugates of the microlens apertures on element 114, indicated by dashed circles (e.g. aperture conjugate 2501), are centered at the grid's line crossings (e.g., crossing 2502), and the surface height structure within each circle is similar to that represented in FIG. 22. (The relationship of the phase plate's surface height $h_j$ to the optical phase shift $\phi_j$ in zone j is described by Eq. 8 in FIG. 12. For a phase mirror, the relationship would be $\phi_j = 4\pi h_j/\lambda$.)

Since element 114 is not in the $\lambda_1$ optical path, it can be designed to impose any kind of phase pattern on $\lambda_2$ without regard to how it would affect $\lambda_1$. For example, a continuous spiral-phase pattern similar to FIG. 18 could be created in each aperture conjugate 2501, although the four-step structure of FIG. 25 would be simpler and easier to manufacture.

The phase plate could also be configured to optimally shift the microlenses' focal-point positions and to control chromatic aberration at the $\lambda_2$ wavelength. This can be achieved by making the phase plate slightly convex or concave over each microlens aperture conjugate. The phase plate would have the form of a shallow microlens array, with individual lens elements resembling FIG. 21. (A reflective surface could similarly be configured as a shallow micromirror array.) The surface curvature on the phase plate would effectively increase or decrease each microlens's optical power at $\lambda_2$ without affecting its optical power at $\lambda_1$.

The phase plate 114 (or phase mirror) could also be used in other ways. It could be designed without the stepped spiral-phase pattern, but with surface curvature, to induce an optimal defocus between wavelengths $\lambda_1$ and $\lambda_2$. In this embodiment, the phase-Fresnel structure on microlens element 1002 in FIG. 16 would not be required. The microlens could resemble FIG. 13, and the separation between $\lambda_1$ and $\lambda_2$ foci 110 and 1301 would be controlled primarily by the upstream phase plate 114. Similarly, the phase-Fresnel structure in the dephasing lens of FIG. 17 would not be needed if the phase plate 114 performs the achromatization function.

The phase plate could be configured to perform the function of both the phase step 1701 in FIG. 17 and the phase-Fresnel surface, obviating the need for either. The surface curvature over each microlens aperture conjugate on phase plate 114 would be designed to bring both wavelengths $\lambda_1$ and $\lambda_2$ to a common focus 110 in FIG. 17, and a $\pi/2$ phase step would be formed on the central areal half of each aperture conjugate to create a $\lambda_2$ null by dephasing. The microlens 1002 in FIG. 17 could then resemble FIG. 13, as the achromitazion and dephasing functions would be performed entirely by the phase plate.

Aperture-Plane Phase Plate (or Mirror)

A limitation of an object-plane phase plate is that the fidelity of the imaged phase pattern on the microlens apertures is limited by the projection system's optical resolution, so high-NA projection optics may be required. This limitation can be overcome by imposing a null-producing phase shift in the $\lambda_2$ aperture plane, not in the object plane.

A $\lambda_2$ null can be created at the microlens focal points, not by imaging a spiral-phase pattern onto the microlens apertures, but rather by imaging a spiral-phase pattern through the microlenses onto the focal points themselves. In this embodiment, element 115 in FIG. 1 or FIG. 9 is a spiral-phase plate, which is conjugate to the photochromic layer in the $\lambda_2$ optical path, i.e., it is substantially imaged by the microlenses onto the photochromic layer. (The null-generating mechanism does not require precise optical imaging.) Element 115 would preferably be in the aperture plane of a telecentric $\lambda_2$ projection system.

An aperture phase plate 115 could have a continuous spiral-phase pattern, such as that illustrated in FIG. 18, or it could be a stepped spiral-phase plate such as that of FIG. 20. It could potentially also be formed on a curved optical surface, as in FIG. 19 or 21, and in some embodiments it could alternatively be a reflective element (a phase mirror). If a continuous spiral-phase pattern such as FIG. 18 is used, the phase plate would induce an axially-symmetric $\lambda_2$ intensity null at each focal point 110 in FIG. 1 or 9, having a focal-plane intensity distribution of the form 2601 illustrated in FIG. 26. If the four-step spiral-phase pattern of FIG. 20 is used, the intensity pattern would have the form 2701 illustrated in FIG. 27. The FIG. 27 pattern has two orthogonal intensity troughs aligned to the phase steps on the phase plate, but the intensity profile in the immediate vicinity of the focal point 110 is very similar to FIG. 26.

One limitation of the above-described embodiment is that the phase shift induced by an aperture phase plate is a function of incidence angle, so it may not be possible to achieve an optimal phase shift over an extended range of incidence angles. This limitation could be overcome by using a ring-field projection system, in which the object and image extent are limited to a narrow range of incidence angles at the $\lambda_2$ aperture plane. Alternatively, the system could be designed with a very high demagnification ratio between the aperture plane and the printing surface, so that the phase plate 115 is a large element with a narrow range of incidence angles.

Figure 28:
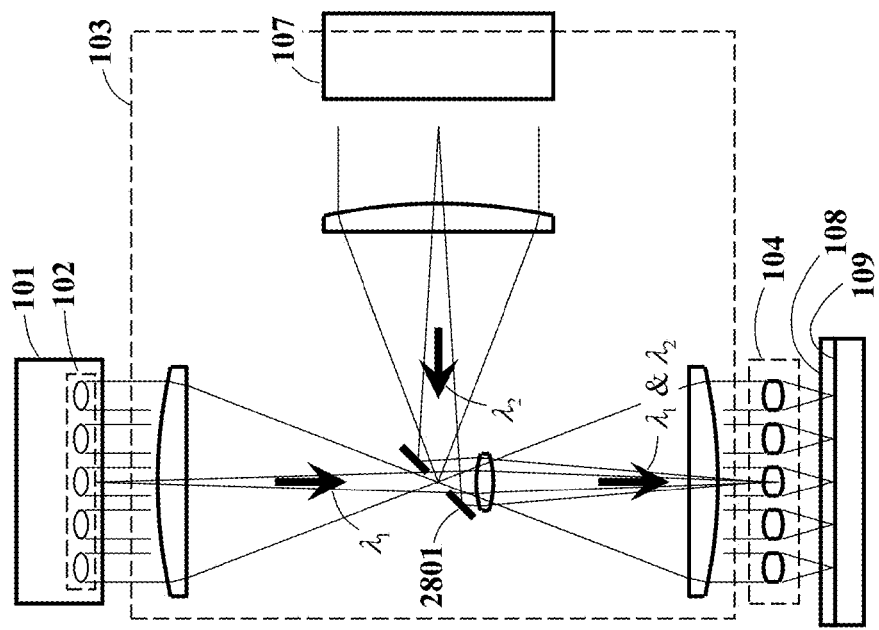
FIG. 28 illustrates a method for creating masking-wavelength nulls by employing an aperture-division beam combiner, which reflects only an annular portion of the masking wavelength.

An alternative way to create the $\lambda_2$ nulls would be to place an axial obscuring mask at the position of element 115 in FIG. 1 or FIG. 9. The image of the obscuration through each microlens would form a focal-plane $\lambda_2$ null having a diffraction-limited intensity distribution similar to distribution 302 in FIG. 3. As illustrated in FIG. 28, a lithography system of this type could employ an aperture-division beam combiner 2801 in the projection system 103. Element 2801 would perform the functions of the dichroic beam reflector 112, projection aperture 113, and null-generating element 115 illustrated in FIG. 1. (A similar type of beam combiner could be substituted in the FIG. 9 microscopy system.) The element comprises a diagonal mirror, which reflects an annular portion of the diffraction-limited, aperture-plane $\lambda_2$ beam, while transmitting an axial portion of the aperture-plane $\lambda_1$ beam through a central aperture stop. The axial portion of the $\lambda_2$ beam intercepting the aperture opening is not reflected, resulting in a $\lambda_2$ null at the center of each microlens focal point. This type of system represents a simple alternative to an aperture-plane spiral-phase plate, although a spiral-phase plate would be expected to provide sharper and more localized optical nulls (as will be made evident in Appendix A).

Embodiments Using Projected Focal Spot Arrays

The previously-described absorbance modulation systems and methods all employ an array of microlenses with focal points proximate the photochromic layer to create a pattern of focused-radiation spots on the layer. But it may be advantageous to generate the focused-radiation spots by directly imaging them from source spots in the upstream optics, without using an intermediate microlens array. A lithography system of this type is illustrated schematically in FIG. 29. This system is qualitatively similar to the FIG. 1 configuration, except that the image-plane microlens array 104 is missing. The $\lambda_1$ radiant-energy spots in the object plane (e.g. spot 105) would be smaller, and would have greater beam divergence in the FIG. 29 system, and the projection optics 103 would comprise much larger and more complex optical elements to accommodate the higher beam divergence and to achieve high optical resolution on the printing surface. In addition, the $\lambda_2$ radiation source 107 would also preferably concentrate the radiation on an array 2901 of small, radiant-energy source spots such as spot 2902. The two sets of source spots 102 and 2901 are in separate, respective $\lambda_1$ and $\lambda_2$ object planes, and are imaged by the projection optics onto a common image plane proximate the photochromic layer 108 on the printing surface 109. For example, spots 105 and 2902 are both imaged onto a the vicinity of focal point 110 to create a focused-energy pattern having the form of distributions 301 (for $\lambda_1$) and 302 (for $\lambda_2$) in FIG. 3. (The same design approach can be applied to microscopy by eliminating the microlens array 104 in FIG. 9 and making the above-noted modifications in the system.)

Figure 29:
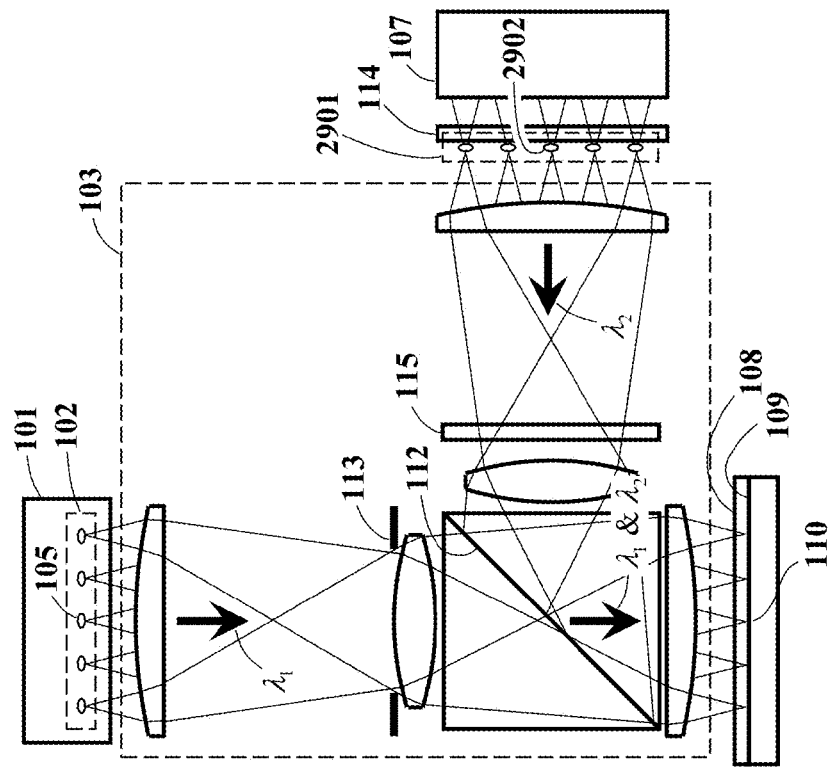
FIG. 29 illustrates an absorbance modulation optical lithography system, which employs projection optics to image a pattern of object-plane source spots directly onto the printing surface without using an intermediate, image-plane microlens array.

FIG. 29 illustrates the photochromic layer 108 as being deposited on the printing surface 109 (or similarly, on an inspection surface in the context of microscopy), but other approaches are possible. The photochromic layer could be deposited on a superstrate and separated from the printing surface or inspection surface by a small air gap, in a manner similar to the FIG. 11 configuration, except that the superstrate would not comprise a microlens array—it would be part of the projection system. The photochromic layer might also be a fluidic medium filling the space between a superstrate and the printing surface or inspection surface.

The FIG. 29 embodiment requires comparatively complex and expensive projections optics, but wide-field, high-numerical-aperture optical systems are well known in the prior art and are more highly evolved than microlens systems. The system may use microlenses to generate the source-spot arrays 102 and 2901, but these would typically be comparatively large elements of low numerical aperture, which would be easier to manufacture than the high-numerical-aperture microlenses in array 104 of FIG. 1. (Although FIG. 29 depicts a 1× projection system, the energy patterns would more typically be imaged onto the printing surface at reduced magnification, so comparatively large, low-NA micro-optics could be used to generate the source spots.)

The $\lambda_2$ nulls can be created in the FIG. 29 system by the previously-described methods. For example, element 114 could be a phase plate with a phase distribution of the form illustrated in FIG. 25, with each grid crossing such as 2502 in FIG. 25 being centered on a corresponding $\lambda_2$ source spot such as 2902 in FIG. 29. This will create a $\lambda_2$ intensity distribution with a null at each focal point on the image plane, such as that illustrated in FIG. 27. In this embodiment the phase plate 114 would not need to be exactly at the object plane containing the $\lambda_2$ source spots 2901. It could be positioned in front of or behind the object plane, but should generally be close enough to the object plane that the light cones projecting through the source spots do not substantially overlap on the phase plate.

Element 114 could alternatively create the optical nulls by simply obscuring a central portion of each spot 2902, although a phase plate would be expected to produce sharper and more localized optical nulls.

In another variant embodiment, the optical nulls could be generated by an aperture-plane spiral-phase plate 115 (either a continuous or stepped spiral-phase plate). In this embodiment, the light cones from the $\lambda_2$ source spots would all overlap on a single, large spiral-phase plate, which would induce all of the optical nulls on the photochromic layer.

It may be advantageous to employ a ring-field projection system in the FIG. 29 embodiment, particularly if an aperture-plane phase plate 115 is used. The advantages of such a system are that it would be easier to achieve good imaging performance over a narrow ring field, it would be easier to accommodate beam-combining optics for merging the $\lambda_1$ and $\lambda_2$ optical paths, and the performance of an aperture-plane phase plate would be more optimum because it would only operate over a narrow range of incidence angles.

Prior-art ring-field projection systems are reviewed, for example, by David M. Williamson in "Evolution of ring-field systems in microlithography," SPIE Proceedings, Vol. 3482 (1998). If absorbance modulation could achieve the same resolution gain as the wavelength reduction in EUV lithography, then the comparatively low-NA ring-field projection systems used for EUV could be adapted for use with absorbance modulation (but without the constraint of requiring all-reflective optics).

Figure 30:
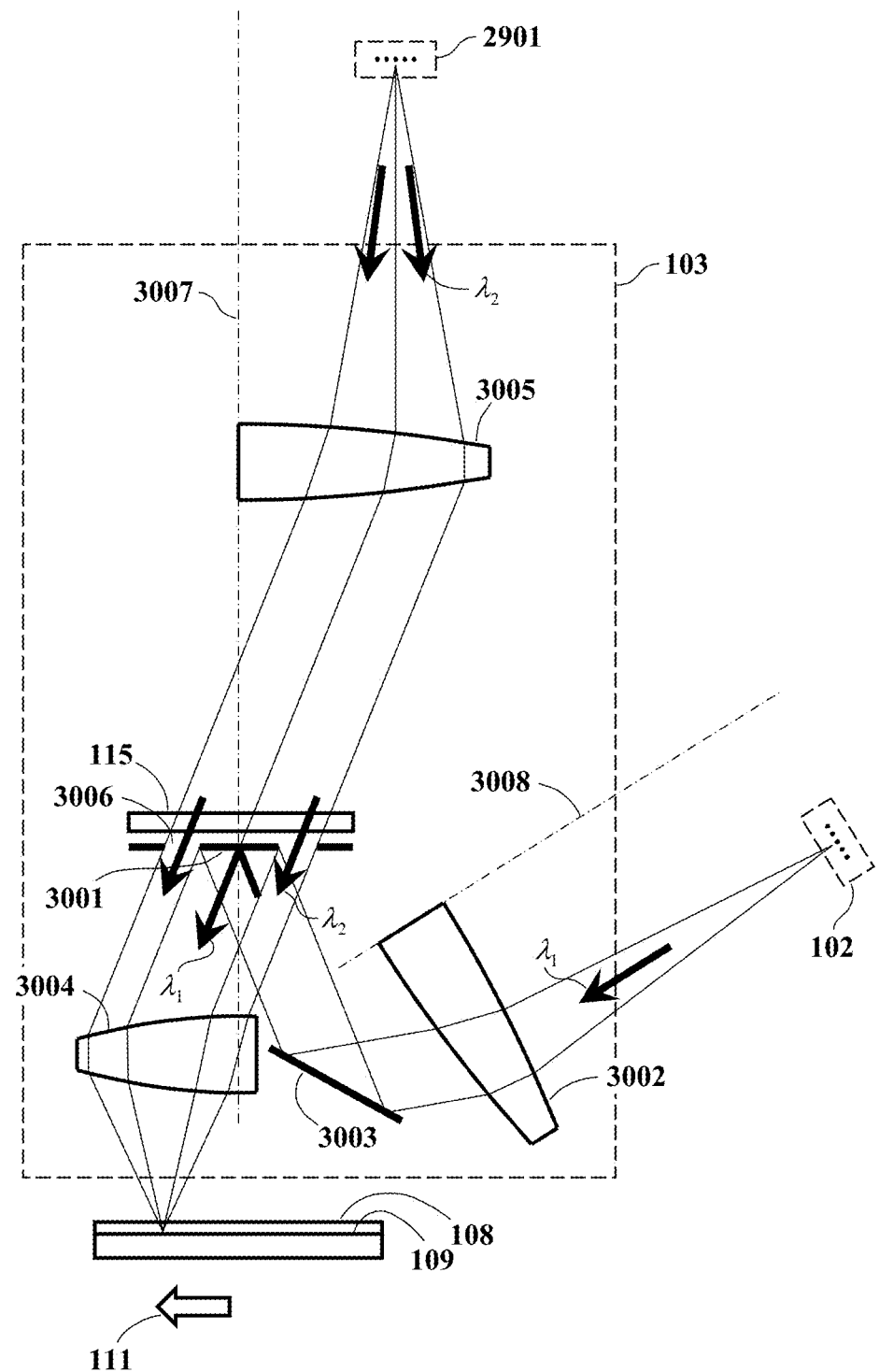
FIG. 30 illustrates an absorbance modulation optical lithography system comprising a double-telecentric, ring-field reduction system.

FIG. 30 schematically illustrates a double-telecentric, ring-field reduction system 103, which uses an aperture-division mirror 3001 as a beam combiner, and which has an aperture-plane phase plate 115 in the $\lambda_2$ optical path. The modulated $\lambda_1$ source-spot array 102 is collimated by lens 3002, reflects off of mirrors 3003 and 3001, and is focused by lens 3004 onto a corresponding array of focused-radiation spots on the photochromic layer 108, which is deposited on the printing surface 109. The mirror 3001 functions as an aperture stop for the $\lambda_1$ optical path. The $\lambda_2$ source-spot array 2901 is collimated by lens 3005 and passes through phase plate 115 and annular aperture 3006, which has a central obscuration defined by the back side of mirror 3001. The aperture-filtered $\lambda_2$ radiation is then focused by lens 3004 and combined with the $\lambda_1$ radiation on the printing surface. The $\lambda_2$ nulls are induced by the phase plate 115, which is a continuous or stepped spiral-phase element having a form similar to FIG. 18 or 20 (or perhaps formed on a curved optical surface, as in FIG. 19 or 21).

The lens 3004 and 3005 surface shapes and the annular aperture 3006 have axial symmetry around optical axis 3007, and the focused-spot images on the printing surface are confined within a narrow, circular arc (the "ring field") centered on the axis. The lens 3002 surface shape similarly has axial symmetry around axis 3008, which is the reflective image of axis 3007 across mirrors 3001 and 3003. Full-field exposure coverage of the printing surface is achieved by synchronously modulating the $\lambda_1$ source spots 102 and scanning the printing surface across the image field (as indicated by the scan direction 111).

The imaging elements 3002, 3004 and 3005 are illustrated as lens elements in FIG. 30, but the projection system 103 could alternatively comprise catoptric or catadioptric optics (e.g., similar to projection optics used in EUV lithography).

Figure 31:
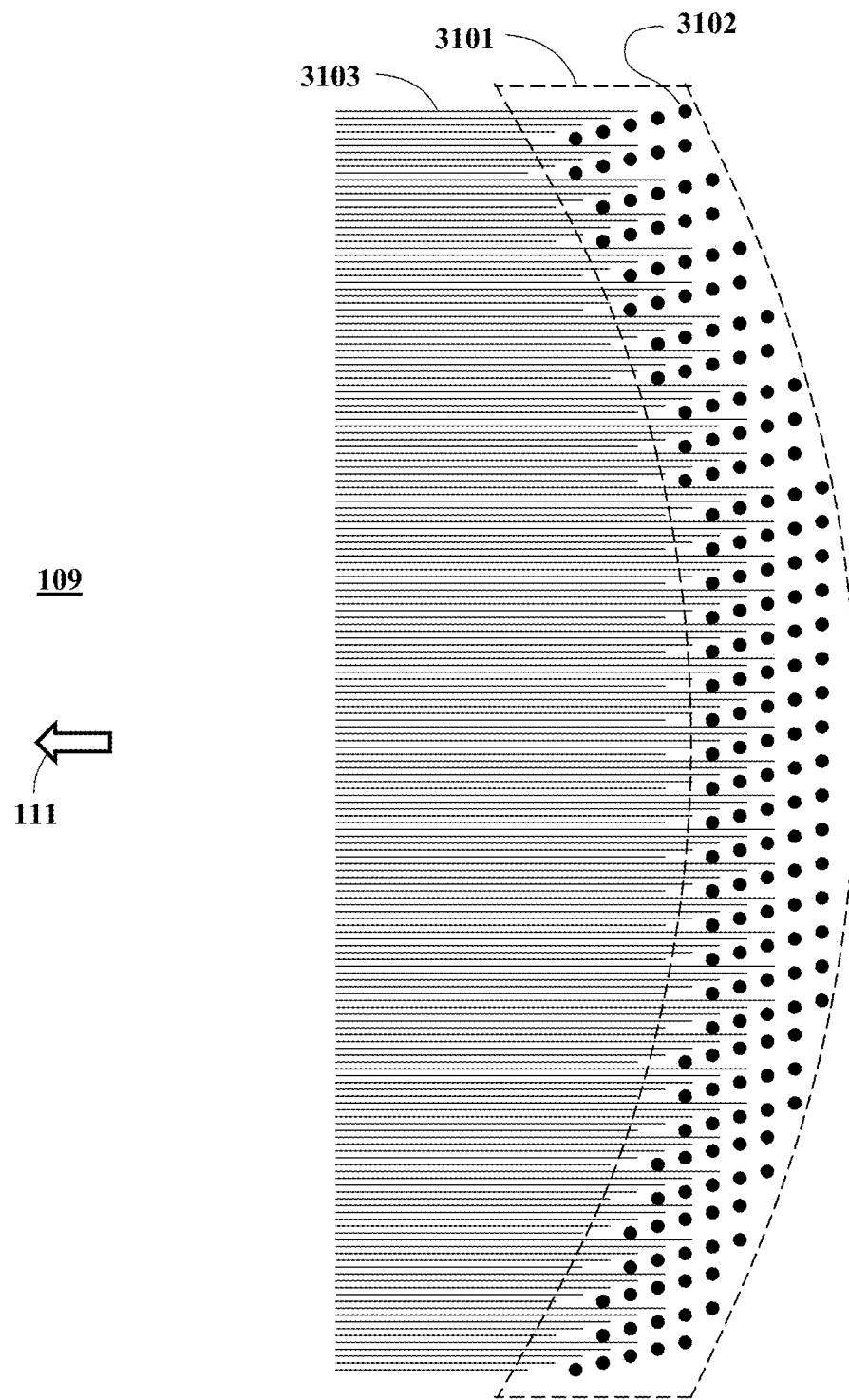
FIG. 31 illustrates the scan process employed by a ring-field lithography system.

The focused-radiation spots are raster-scanned across the printing surface, e.g., in a "step-and-scan" process. FIG. 31 illustrates the scan process. The focused-radiation spots fill an arc-shaped ring field 3101 over the printing surface 109. Each spot traces a raster line on the printing surface as the surface is scanned across the image field (e.g. spot 3102 traces line 3103). The scan direction is indicated as 111. The raster line density is limited by the number of spots in the image field, but multiple scans can be performed to print dense, interleaved sets of raster lines.

In the FIG. 30 configuration, wavelengths $\lambda_1$ and $\lambda_2$ are directed onto the image plane from within separate, non-overlapping numerical aperture ranges, as illustrated in FIG. 32. The figure depicts the system aperture stop, as viewed from a point on the printing surface. Wavelength $\lambda_2$ fills the outer, annular aperture 3006, while wavelength $\lambda_1$ fills the inner aperture region defined by mirror 3001.

Other forms of aperture-division beam combining are also possible. For example, FIG. 33 illustrates an alternative aperture configuration that uses a quadrupole aperture for wavelength $\lambda_1$. For example, the $\lambda_1$ aperture zones 3301, 3302, 3303 and 3304 could be defined by four reflective pads on a transparent plate forming mirror 3001 in FIG. 30. The $\lambda_2$ radiation fills the complement of the quadrupole aperture within an enclosing circular aperture 3305. Alternatively, the two wavelengths could be combined by means of a dichroic reflector.

The $\lambda_1$ source-spot array 102 in FIG. 30 could be generated with an SLM such as the Digital Micromirror Device or Grating Light Valve, using a microlens array to condense the reflected beams onto small focused-radiation source spots, as illustrated in FIG. 34. Collimated, incident illumination 3401 is directed by a beam splitter 3402 toward an SLM 101 comprising an array 401 of modulated, reflective pixel elements. A microlens array 3403 in front of the SLM focuses the radiation impinging on each pixel so that the reflected beam from that pixel is concentrated on a corresponding spot of source-spot array 102. For example, microlens 3404 converges radiation impinging on pixel 3405 to focus the reflected beam on spot 105 proximate the center of the microlens. (This represents the condition in the pixel's "ON" state. In its "OFF" state pixel 3405 deflects the reflected radiation out of microlens 3404.)

The $\lambda_1$ source-spot array 102 in FIG. 30 could alternatively be generated from a tandem-scanning photomask such as that illustrated in FIG. 5, but with the microlens array 507 omitted. (The $\lambda_1$ spots 102 in FIG. 30 would be the spot array 505 in FIG. 5.)

The $\lambda_2$ source-spot array can be generated from a micromirror array as illustrated in FIG. 35 (cf. FIG. 30). $\lambda_2$ radiation is focused onto a backside mirror on element 3001, and is reflected toward lens 3005, which collimates the radiation and directs it toward micromirror array 3501. As illustrated in FIG. 36, convex micromirrors diverge the reflected radiation, so that it effectively originates from an array of virtual source spots behind the micromirror. For example, the radiation reflected from micromirror 3601 diverges from virtual point 105. Concave micromirrors could alternatively be used to direct the $\lambda_2$ radiation through source spots in front of the micromirrors; or the source-spot array 2901 could be generated by a backside-illuminated microlens array.

The micromirrors in array 3501 could be configured as a spiral-phase mirrors having a surface form similar to that illustrated in FIG. 21. In this embodiment element 115 in FIG. 30 would not be required because the micromirror array 3501 would perform the function of element 114 in FIG. 29, imposing a null-producing spiral-phase pattern on each individual $\lambda_2$ source spot.

Lithography Embodiments Using Full-Field Illumination

The preceding absorbance modulation lithography systems and methods all concentrate the $\lambda_1$ and $\lambda_2$ radiation onto a focal-point array over a printing surface, and use a raster-scanning technique to print a full-field image. An alternative approach would be to replace the source-spot arrays 102 and 2901 in FIG. 29 with full-field (or ring-field) illuminated patterns, which are generated from two tandem-scanning photomasks, one for each wavelength, and which are both imaged onto a photochromic layer over the printing surface. The system would preferably use ring-field projection optics. This type of system is illustrated schematically in FIG. 37. A projection system 103 has $\lambda_1$ and $\lambda_2$ optical paths with corresponding $\lambda_1$ and $\lambda_2$ object planes and a common image plane. Photomasks 3701 and 3702, which are in the respective $\lambda_1$ and $\lambda_2$ object planes, are illuminated by wavelengths $\lambda_1$ and $\lambda_2$, respectively, and are imaged by the projection optics onto an image plane proximate a photochromic layer 108, which is deposited on a printing surface 109. Each photomask is scanned across a fixed illumination field (e.g., a ring field), which covers only a portion of the photomask area at any one time. The photomasks 3701 and 3702, and printing surface 109, are synchronously scanned in directions 3703, 3704, and 111, respectively, during the exposure process to achieve full-field illumination coverage while maintaining imaging registration between the photomasks and the printing surface. This is similar to a conventional step-and-scan lithographic process, except that the $\lambda_2$ image creates a masking pattern in the photochromic layer 108, with $\lambda_1$ transmittance zones defined by the null regions in the $\lambda_2$ image.

The $\lambda_2$ nulls can be created using standard phase-shift mask methods. For example, an optical phase discontinuity of $\pi$ along a line on mask 3702 will create an optical null along the line image on the photochromic layer. A four-quadrant phase pattern such as that illustrated in FIG. 22 will create an isolated point null. These types of phase-shift patterns can be used to define highly resolved, isolated print features. It may not be possible to create dense patterns of such features in a single exposure, but multiple exposures of isolated patterns can be interleaved to form dense patterns.

APPENDIX A

Theoretical-Optics Model of Absorbance Modulation Systems

The Kirchhoff integral

The diffraction-limited focusing characteristics of optical systems can be approximately described by a scalar Kirchhoff integral, based on the integration geometry illustrated in FIG. 38 (in elevational view) and FIG. 39 (in plan view). Equations accompanying Appendix A are tabulated in FIGS. 40A-D and 41.

A monochromatic light beam of wavelength $\lambda$ is focused onto the vicinity of focal point $\vec{P}$ at the intersection of focal plane 3801 and beam axis 3802 (FIG. 38). The scalar electromagnetic field's complex amplitude U at any point $\vec{x}$ near $\vec{P}$ is defined by a Kirchhoff integral over points $\vec{x}'$ on a spherical surface S of radius R centered at $\vec{P}$. The radius R and outward-directed surface normal $\hat{n}$ at point $\vec{x}'$ on S are defined by Eq's. A1 and A2 (FIG. 40A). The Kirchhoff integral has the form given by Eq. A3. (J. W. Goodman, *An Introduction to Fourier Optics* (McGraw-Hill, 1996), Eq. 3-23 on p. 44.) In this equation G is a Green's function, $\nabla'$ is the gradient operator with respect to $\vec{x}'$, and ds is a differential area element on S at $\vec{x}'$. The "$\propto$" symbol means "proportional to." (The proportionality factor is irrelevant to the present analysis.) Square braces "[ . . . ]" are used to delimit function arguments in Eq. A3 and other equations to follow.

The Green's function in Eq. A3 has the form given by Eq. A4 for wavelength $\lambda$, and its gradient has the approximate form of Eq. A5 assuming that the distance $|\vec{x}-\vec{x}'|$ is large compared to $\lambda$. Assuming further that $|\vec{x}-\vec{P}|$ is small compared to R, the $\vec{x}-\vec{x}'$ factors in Eq's. A4 and A5 can be approximated as $\vec{x}-\vec{x}' \approx \vec{P}-\vec{x}' = -R\hat{n}$, except in the exponential where the large $1/\lambda$ factor necessitates a more accurate approximation for $|\vec{x}-\vec{x}'|$, Eq. A6. This simplifies Eq's. A4-A5 to Eq's. A7-A8. Also, assuming that the field $U[\vec{x}']$ on S is an integral superposition of point-convergent fields converging to points near $\vec{P}$, the field's gradient on S has the approximate form given by Eq. A9. With substitution of Eq's. A7-A9, the Kirchhoff integral, Eq. A3, simplifies to Eq. A10. (The exponential factor's $\vec{x}'$ dependence in Eq. A10 is implicit in $\hat{n}$.)

It will be convenient to parameterize $\vec{x}$ in terms of cylindrical coordinates r, $\psi$ and z, and to parameterize $\vec{x}'$ in terms of polar angles $\alpha$ and $\theta$, as defined in Eq's A11-A12 and illustrated in FIGS. 38 and 39. $\hat{e}_1$, $\hat{e}_2$ and $\hat{e}_3$ are unit basis vectors, with $\hat{e}_1$ directed along the beam axis 3802 (normal to the focal plane 3801), and with $\hat{e}_2$ and $\hat{e}_3$ parallel to the plane. The differential area ds in Eq. A10 associated with differential angles d$\alpha$ and d$\theta$ is given by Eq. A13, and the integral in Eq. A10 translates to Eq. A14.

The integration range on $\alpha$ in Eq. A14 is limited by the convergent beam's numerical aperture limit, NA, according to Eq. A15. It will be convenient to reformulate the $\alpha$ integral in terms of an integration variable $\rho$, defined by Eq. A16, where $\rho$ ranges from 0 to NA. The source field $U[\vec{x}']$ on S is rewritten as $A[\rho,\theta]$ (Eq. A17), the field $U[\vec{x}]$ in the vicinity of the focal plane is written as $U[z,r,\psi]$ (Eq. A18), and Eq. A14 is restated as Eq. A19 (with integration limits indicated). The proportionality sign "$\propto$" in Eq. A14 is replaced by equality in Eq. A19, and a factor of $1/2\pi$ is included to normalize the focal-point field $U[0,0,\psi]$ to 1 for a unit-amplitude source field $A[\rho,\theta]$ over a full hemispherical surface S (Eq. A20).

The scalar Kirchhoff integral is not numerically accurate for large-NA beams, but it suffices to illustrate the comparative performance characteristics of various microlens forms. Most cases of interest have the property that the source amplitude $A[\rho,\theta]$ is separable into a radial ($\rho$-dependent) factor $A^{[rad]}[\rho]$ and an azimuthal ($\theta$-dependent) factor $A^{[az]}[\theta]$ according to Eq. A21. With this substitution, Eq. A19 translates to Eq. A22.

Axisymmetric Lens Forms

For the axisymmetric lens forms, the $A^{[az]}[\theta]$ factor in Eq. A22 is identically 1 and the $\theta$ integral reduces to a Bessel function. The focused field amplitude $U[z,r,\psi]$ is also axisymmetric ($\psi$-independent), and Eq. A22 reduces to Eq. A23. If the factor $A^{[rad]}[\rho]$ is also identically 1, the focal-plane (z=0) amplitude has the form of Eq. A24 (the classical Airy diffraction pattern) in a low-NA approximation. The axial (r=0) amplitude has the form of Eq A25.

Figure 42:
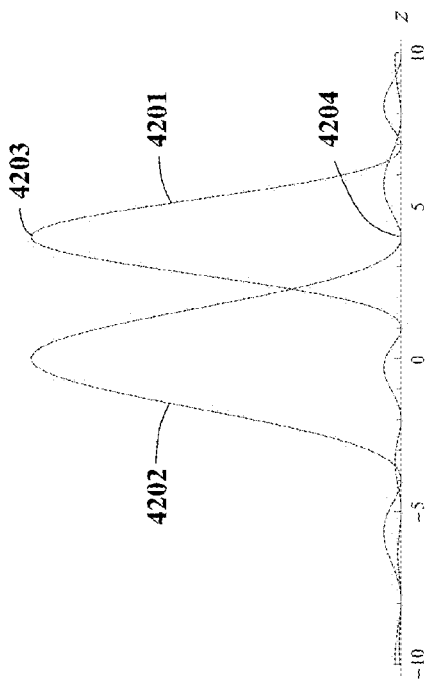
FIG. 42 illustrates axial electromagnetic field intensity plots, for the imaging and masking wavelengths, in the vicinity of the focus of a refractive microlens such as that of FIG. 13.

Eq. A25 indicates that the axial field exhibits optical nulls at discrete points, as indicated by Eq. A26. A dual-wavelength lens of the form illustrated in FIG. 13 can be designed by causing one of the null points at wavelength $\lambda_2$ to coincide with the focal point at wavelength $\lambda_1$. For example, FIG. 42 illustrates plots of $|U[z,0]|^2$ (field intensity) as a function of z (microns), with NA=0.5, for two wavelengths: $\lambda_1$=0.400 micron (plot 4201) and $\lambda_2$=0.532 micron (plot 4202). There is a 4 micron chromatic offset between the focus peaks, and the peak 4203 of the $\lambda_1$ plot coincides with a null 4204 of the $\lambda_2$ plot. This condition is achieved when Eq. 1 in FIG. 12 holds.

Eq. 1 can be obtained by combining Eq. A26 with Eq. 2 and a similar equation for $\lambda_2$ Eq. A27. In Eq's. 2 and A27, $n_1$ and $n_2$ are the lens refractive indices at $\lambda_1$ and $\lambda_2$, respectively, and $F_1$ and $F_2$ are the corresponding focal lengths; cf. FIG. 13. The focus offset z in Eq. A26 (with A=$\lambda_2$) is set equal to the chromatic dispersion-induced focus offset, $F_2-F_1$, according to Eq. A28. m can be any non-zero integer in Eq. A28, and for the special case m=±1, Eq. 1 is obtained.

Figure 43:
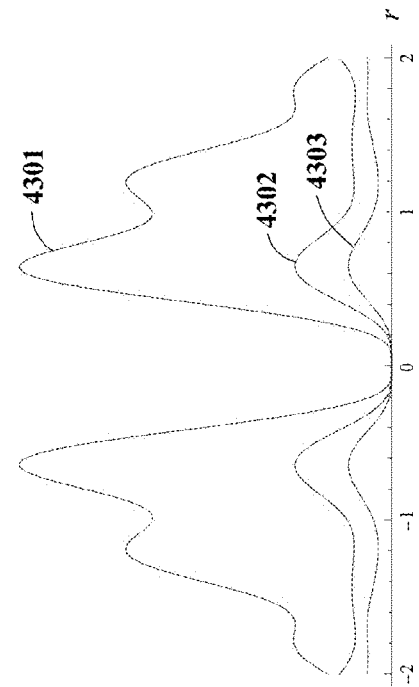
FIG. 43 illustrates radial electromagnetic field intensity plots, at the masking wavelength, through several axial nodes of a refractive microlens such as that of FIG. 13.

An integer m larger than 1 could be used in Eq. A28. This would result in a larger lens, but the $\lambda_2$ null would be much less sharply defined. For example, FIG. 43 illustrates plots of $|U[z,r]|^2$ as a function of r (microns), based on Eq. A23 with $A^{[rad]}[\rho]$=1, NA=0.5, and $\lambda$=0.532 micron, for several z values defined by Eq. A26 with m=1 (plot 4301), m=2 (plot 4302), and m=3 (plot 4303). The field amplitude in the vicinity of a null is characterized by a small-r approximation to Eq. A23, as stated in Eq. A29. The z term in Eq. A29 is defined by Eq A26 with a non-zero integer m, and the last equality is a small-NA approximation.

Eq's. A24-A29 assume an ideal, point-convergent beam of uniform intensity over the integration surface S. If the lens transmittance is nonuniform with radius, the illumination profile on the lens can be controlled to counterbalance the nonuniformity. (FIG. 14 illustrates one possible mechanism for tuning the illumination profile on lens 1002.) In addition, the illumination profile can also counterbalance spherical aberration in the lens, as follows:

To illustrate the method, we consider a source field $A^{[rad]}[\rho]$ of the approximate form $\exp[-a\rho^2+i s \rho^4]$, where a is a radial attenuation factor (which is determined by a combination of the lens transmittance and illumination profile) and s is a spherical aberration coefficient. (a and s are real-valued.) A small-NA approximation is applied in Eq. A23 to characterize the axial field, Eq. A30, where q is defined by Eq. A31. Assuming that a and s are small, the last integral in Eq. A30 can be approximately evaluated by applying two integration-by-parts operations, as outlined in FIG. 41, and retaining only terms that are linear in a and s. (The last integral in FIG. 41 is neglected because it is quadratic in a and s.) Applying the integration limits to the result in FIG. 41, Eq. A32 is obtained. A null is obtained when this expression is zero, Eq. A33.

The real and imaginary parts of Eq. A33 define two equations in two unknowns, a and q, which are controlled by the illumination profile and defocus, respectively. Taking the magnitude of both sides of Eq. A33 and multiplying by exp[a $NA^2$], Eq. A34 is obtained. Again neglecting quadratic terms in a and s, and substituting exp[a $NA^2$]≈1+a $NA^2$, Eq. A34 reduces to Eq. A35. This is used to eliminate s in Eq. A33 (except in the exponential), yielding Eq. A36; and the approximation 1+a $NA^2$≈exp[a $NA^2$] reduces this to Eq. A37. q is thus defined by Eq. A38, which is back-substituted into Eq. A35 to obtain a. (If s=0, then the z value obtained from Eq's. A38 and A31 is equivalent to that defined by Eq. A26 in a small-NA approximation.)

The preceding results are based on scalar Kirchhoff diffraction theory, and they apply to an axially-symmetric lens; but similar methods can be applied to obtain a precise $\lambda_2$ optical null under more general conditions. A precise masking null can be achieved at least if the lens has reflective symmetry across a plane containing the lens axis, and is also symmetric with respect to rotation by some angle other than an integer multiple of π around the lens axis. For example FIG. 44 illustrates a plan view of a hexagonal-aperture lens 4401, which has these properties. The lens has a plane 4402 of reflective symmetry containing the axis 4403, and it is symmetric with respect to axial rotation by π/3.

Uniform or symmetrically distributed incident illumination at wavelength $\lambda_2$, which is linearly polarized parallel to the symmetry plane, will remain linearly polarized in the symmetry plane after transmitting through the lens, as a result of the lens symmetry. Furthermore, if a precise null is achieved on axis for that polarization, it will similarly be achieved with the incident polarization direction rotated by the symmetry angle. Since the null is achieved for two distinct linear polarizations, it will be achieved for any incident polarization state. Thus, the design problem reduces to one of achieving a diffraction null for a particular linear polarization component, with the incident illumination linearly polarized in a particular direction. The real and imaginary parts of the polarized diffraction amplitude must both be zero on axis, so there are two scalar design constraints. Two design parameters such as a and q (radial illumination attenuation and defocus) provide sufficient degrees of freedom to achieve both constraints. Although the above analysis was applied to a simple refractive lens such as that illustrated in FIG. 13, the illumination profile and defocus can be similarly optimized to achieve a precise optical null with other lens forms such as those described below.

The axial amplitude distribution from a lens having a circular central obscuration 1501 in FIG. 15 can be calculated as in Eq. A25, except that the ρ integral has a positive lower limit $\rho_0$ as shown in Eq. A39. For this case, the condition for an axial null, Eq. A26, is modified as in Eq. A40, and the lens geometry constraint, Eq. A28, is modified as in Eq. A41 (from Eq's. 2, A27 and A40). The last equality in Eq. A41 is based on a low-NA approximation, and is equivalent to Eq. A28 except for the right-hand factor of $NA^2/(NA^2-\rho_0^2)$. This shows that the linear dimension of the lens would be increased in approximate proportion to the ratio of the full circular aperture area (represented by the $NA^2$ numerator) to the unobscured annular aperture area (represented by the $NA^2-\rho_0^2$ denominator).

Figure 45:
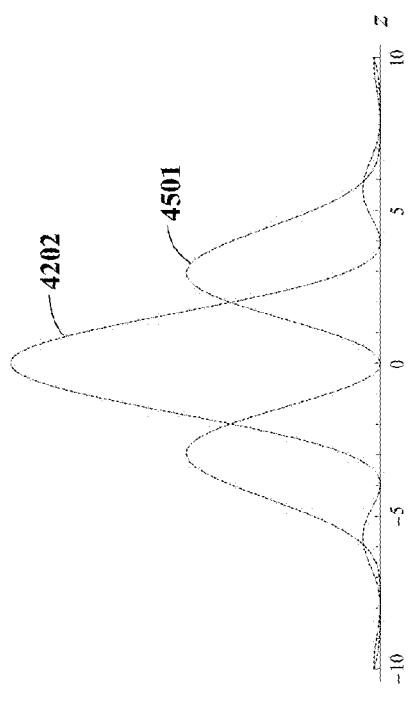
FIG. 45 illustrates axial electromagnetic field intensity plots, for the imaging and masking wavelengths, in the vicinity of the focal plane of a dephasing microlens such as that of FIG. 17.

For the dephasing lens illustrated in FIG. 17, the source field A[ρ,θ] exhibits a phase step of φ at ρ=$\rho_0$, and Eq A25 is modified as in Eq A42. This equation is applied at the masking wavelength λ=$\lambda_2$, and z is the focus offset between the $\lambda_1$ and $\lambda_2$ focal planes. $\rho_0$ and φ can be chosen to make the real and imaginary parts of the amplitude zero at the specified z position. If z=0 (either because the lens is dispersionless or because a dispersion-compensating mechanism such as a phase-Fresnel surface is employed to eliminate the focus offset), then Eq. A42 simplifies to Eq. A43, and the design conditions stated in Eq. A44 result in a null. (However, it may be advantageous to configure the dispersion-compensating mechanism to induce a small focus offset z between $\lambda_1$ and $\lambda_2$, in order to tune φ so that the phase step does not significantly affect the $\lambda_1$ focus.) FIG. 45 illustrates plots of $|U[z,0]|^2$ (from Eq. A42) as a function of z (microns), with NA=0.5, without dephasing (φ=0, plot 4202, same as FIG. 42) and with dephasing at z=0 (φ=π, plot 4501).

Spiral-Phase Lens Forms

The axisymmetric lens forms discussed above are all based on the premise that the source field A[ρ,θ] has no azimuth dependence ($A^{[az]}[\theta]$=1 in Eq. A22). Considering now the case where there is azimuth dependence, an axial null can be obtained if the azimuthal average of A[ρ,θ] is zero for all ρ. This result, which follows from Eq. A19, is shown in Eq. A45. A spiral-phase lens can, in general, be defined by the condition in Eq. A45, which can be paraphrased as follows: A spiral-phase lens has an optical axis, and has the property that with an incident beam of a particular wavelength directed along the axial direction, the azimuthal average of the transmitted beam's complex amplitude is zero.

Figure 46:
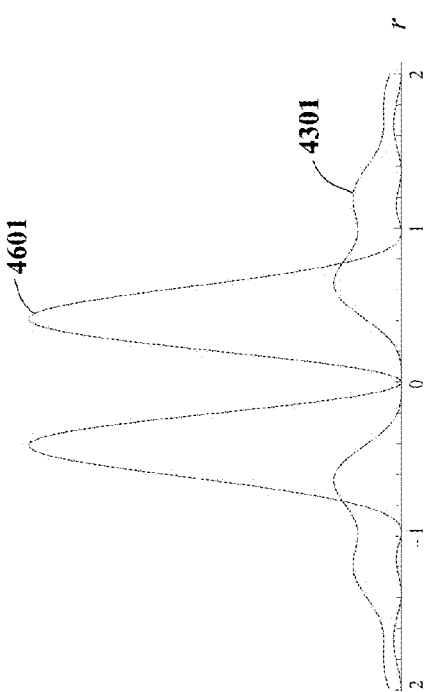
FIG. 46 illustrates radial electromagnetic field intensity plots, at the masking wavelength, for a refractive microlens such as that of FIG. 13 and a spiral-phase lens such as FIG. 19.

The spiral-phase lens forms illustrated in FIGS. 19 and 21 have the property that the transmitted field's complex amplitude is separable in ρ and θ, as in Eq. A21. The most common type of spiral-phase lens (FIG. 19) induces an azimuth-proportionate phase shift in the beam, A[ρ,θ]=exp[i θ]. For this lens form, the focal-plane (z=0) field amplitude in Eq. A19 has the approximate form of Eq. A46 for small r. The last equality in Eq. A46 is a small-NA approximation. The amplitude is approximately proportional to r for small r, whereas the null-field amplitude of an axially symmetric lens (Eq. A29) is approximately proportional to $r^2$. As a result, a spiral-phase lens can produce a much sharper and more localized optical null than is possible with axially-symmetric lens designs. For example, FIG. 46 shows plots of $|U[0,r,\psi]|^2$ versus r (microns) based on numerical evaluation of the integrals in Eq. A29 (plot 4301, same as FIG. 43) and Eq. A47 (plot 4601), with NA=0.5 and λ=0.532 micron.

Alternative types of spiral-phase lenses induce a phase shift of the form $A^{[az]}[\theta]$=exp[i φ[θ]], where φ[θ] is a real-valued function of azimuth θ (e.g. φ[θ]=θ in Eq. A46). For the four-step spiral-phase lens illustrated in FIG. 21, φ[θ] is a step function of θ and the focal-plane amplitude has the approximate form of Eq A47. (The function floor[x] gives the greatest integer less than or equal to x.) The last equality in Eq. A47 is a small-NA approximation. For small r, the focal-plane amplitude in Eq. A47 is the same as that of Eq. A46 except for a factor of 2 (1−i)/π=0.900 exp[−iπ/4].

APPENDIX B

Phase-Fresnel Lens Design

A phase-Fresnel lens is a type of Fresnel lens that is designed to preserve phase coherence between Fresnel zones (FIG. 16), and which has the form of a blazed, (typically) circular diffraction grating. Such lenses are typically used to achieve the functionality of a conventional lens or phase plate with a much thinner, planar element, as described by K. Miyamoto in "The Phase Fresnel Lens," Journal of the Optical Society of America, Vol. 51, No. 1, pp. 17-20 (1961). An application of such lenses for maskless lithography is disclosed in U.S. Pat. No. 6,960,773. Phase-Fresnel lenses can also be used to mitigate chromatic dispersion in the manner described in U.S. Pat. No. 5,161,057. In the context of absorbance modulation, a phase-Fresnel lens surface can be used to direct wavelengths $\lambda_1$ and $\lambda_2$ to separate, predetermined foci so that $\lambda_2$ exhibits a defocus null at the $\lambda_1$ focus (FIG. 13). Alternatively, a phase-Fresnel lens can be used to bring both wavelengths to a common focus, with the $\lambda_2$ null being induced by either by a radial phase step on the lens (FIG. 17) or by azimuthal phase steps in the form of a stepped spiral lens (FIG. 21).

A phase-Fresnel lens 1002 of the type illustrated in FIG. 16 can be designed by a phase-matching procedure. (Refer to the equations in FIG. 47 and the cross-sectional schematic illustration in FIG. 48.) The first step is to define phase functions for each of the wavelengths $\lambda_1$ and $\lambda_2$ in the vicinity of the lens's focal region 4801. The phase functions at any point $\vec{x}$ in the focal region are denoted as $\Phi_1[\vec{x}]$ and $\Phi_2[\vec{x}]$ for $\lambda_1$ and $\lambda_2$, respectively. These functions are typically defined as point-convergent spherical waves, as defined in Eq's B1 and B2, with $\lambda_1$ converging to point $\vec{P}$ and $\lambda_2$ converging to point $\vec{P}'$. (Points $\vec{P}$ and $\vec{P}'$ in FIG. 48 correspond to 101 and 1301 in FIG. 16.) The "const" terms in Eq's B1, B2, and other equations to follow are arbitrary, uncorrelated constants.

The phase functions are extended into the interior of lens 1002 by applying two conditions. First, the phase must be continuous across the lens's bottom surface; and second, it must satisfy the eikonal equation defined by Eq's B3 and B4 for $\lambda_1$ and $\lambda_2$ respectively, where $n_1$ and $n_2$ are the respective refractive indices for $\lambda_1$ and $\lambda_2$. (Eq's. B1 and B2 satisfy the eikonal equation in air.) The phase function can be calculated by a ray tracing procedure (e.g., $\Phi_1[\vec{x}]$ is proportional to the optical path length along a $\lambda_1$ ray from $\vec{P}$ to $\vec{x}$, except for an arbitrary additive constant.)

Phase functions for the incident beam above the lens are also separately specified. These functions are denoted as $\Phi_1'[\vec{x}]$ and $\Phi_2'[\vec{x}]$ for $\lambda_1$ and $\lambda_2$, respectively. For a plane-wave incident beam directed along the lens axis, these functions have the form of Eq's. B5 and B6, where $\hat{e}_1$ is an upward-directed axial unit vector (FIG. 48). If the top lens surface did not have a grating structure, the phase functions would have to be matched on the surface, within an undetermined constant, i.e., $\Phi_1[\vec{x}]=\Phi_1'[\vec{x}]+const$ and $\Phi_2[\vec{x}]=\Phi_2'[\vec{x}]+const$. Either of these conditions could be used to define the surface, but both conditions could not be imposed simultaneously without the extra degree of freedom afforded by the grating.

The grating comprises Fresnel zones indicated as zone 0, zone 1, etc. in FIG. 48. In an axially-symmetric lens, zone 0 is circular and zones 1, 2, etc. are annular, although these conditions need not apply in general. The inner boundary of zone j is denoted as $\gamma_j$ (e.g., $\gamma_0$, $\gamma_1$, etc. in FIG. 48). These boundaries are typically circular curves, except that $\gamma_0$ is an isolated axial point.

Phase-matching conditions having the form of Eq's. B7 and B8 are applied on the boundary curves. The grating operates in diffraction order $m_1$ at wavelength $\lambda_1$, and in order $m_2$ at wavelength $\lambda_2$. The integers $m_1$ and $m_2$ and the two (uncorrelated) const terms are free design parameters. (In each of Eq's. B7 and B8, the same const applies to all j indices.) The axial point $\gamma_0$ would typically be predetermined, and the const terms would be defined by substituting $\gamma_0$ for z in Eq's. B7 and B8. For each index j>0, the locus of points satisfying both Eq. B7 and Eq. B8 defines the curve $\gamma_j$.

Having defined the zones' inner boundaries, the surface shape in each zone can be "blazed" to concentrate most of the diffracted energy at one or both wavelengths onto the vicinity of the focal point $\vec{P}$. For example, the surface shape can be blazed for wavelength $\lambda_1$ by defining the surface shape on zone j to satisfy Eq. B7 over the zone's entire surface, not just on $\gamma_j$, as indicated by Eq. B9. (This is the $m_1$-order blaze condition for wavelength $\lambda_1$.) The zone surfaces could alternatively be blazed for wavelength $\lambda_2$ (in order $m_2$) by using Eq. B8, rather than Eq. B7, to define the zone j surface shape (Eq. B10). The benefit of optimizing efficiency at $\lambda_2$ is that this will tend to result in a high-intensity, annular-radiation spot with a sharper, more localized optical null at point $\vec{P}$. The zone surfaces could also be configured to balance the efficiency loss between wavelengths $\lambda_1$ and $\lambda_2$, e.g., by using a linear combination of Eq's. B7 and B8 to define the zone surfaces, as in Eq. B11. (The b term in Eq. B11 is a balancing factor, which is adjusted between 0 and 1 to optimize the efficiency tradeoff between $\lambda_1$ and $\lambda_2$.)

The separation distance between points $\vec{P}$ and $\vec{P}'$ can be chosen to produce a $\lambda_2$ defocus null at point $\vec{P}$ (e.g., by applying Eq. A26 in FIG. 40B to define the separation distance z, preferably with m=±1.). Alternatively, $\vec{P}'$ can be coincident with $\vec{P}$, and the $\lambda_2$ null can be induced by incorporating a radial phase step such as 1701 (FIG. 17) in one of the lens surfaces (e.g., according to Eq's. 6-7 in FIG. 12). In a variation of this approach, $\vec{P}'$ is displaced from $\vec{P}$ by a distance z; the phase step is determined by choosing $\rho_0$ and $\phi$ in Eq. A42 to make U[z,0]=0 (for wavelength $\lambda_2$); and z is chosen to minimize $\lambda_1$ dephasing (by making the phase shift $\phi$ an integer multiple of $2\pi$ for wavelength $\lambda_1$). In another approach, $\vec{P}'$ coincides with $\vec{P}$ and the $\lambda_2$ null is induced by adding azimuthal phase steps to one of the surfaces (as in FIGS. 20 and 21; Eq's 9-10 in FIG. 12) to form a stepped, spiral-phase lens.

REFERENCES

The following references are referred to above are hereby incorporated by reference:

K. Miyamoto in "The Phase Fresnel Lens," Journal of the Optical Society of America, Vol. 51, No. 1, pp. 17-20 (1961)

J. W. Goodman, *An Introduction to Fourier Optics* (McGraw-Hill, 1996), Sect. 3.4.2, pp. 44-45

D. M. Williamson, "Evolution of ring-field systems in microlithography," SPIE Proceedings, Vol. 3482 (1998)

T. Watanabe, M. Fujii, Y. Watanabe, N. Toyoma, and Y. Iketaki, "Generation of a doughnut-shaped beam with a spiral phase plate," Rev. Sci. Instrum. 75, 5131-5135 (2004)

R. Menon and H. I. Smith in "Absorbance-modulation optical lithography," Journal of the Optical Society of America A, Vol. 23, Issue 9, pp. 2290-2294 (2006)

H-Y. Tsai, H. I. Smith, and R. Menon, "Fabrication of spiral-phase diffractive elements using scanning-electron beam-lithography," J. Vac. Sci. Technol. B 25, pp. 2068-2071 (2007)

R. Menon, P. Rogge, and H. Tsai, "Design of diffractive lenses that generate optical nulls without phase singularities," Journal of the Optical Society of America A, Vol. 26, Issue 2, pp. 297-304 (2009)

H. Tsai, E. E. Moon, and R. Menon, in "Far-Field Optical Imaging at the Nanoscale via Absorbance Modulation," *Novel Techniques in Microscopy*, OSA Technical Digest (CD) (Optical Society of America, 2009), paper NMA2.

U.S. Pat. No. 5,161,057
U.S. Pat. No. 5,900,637
U.S. Pat. No. 6,133,986
U.S. Pat. No. 6,177,980
U.S. Pat. No. 6,424,404
U.S. Pat. No. 6,498,685
U.S. Pat. No. 6,960,773
U.S. Patent Pub. 2009/0046299 A1
U.S. Patent Pub. 2010/0097703 A1

CONCLUSION

In conclusion it can be seen that embodiments of the present invention provide novel imaging systems and methods for absorbance modulation optical lithography and microscopy. A microlens array can be employed to direct imaging and masking wavelengths onto a photochromic layer proximate the microlens focal plane. Optical nulls at the masking wavelength are generated with dual-wavelength microlenses having one of several forms including refractive lenses, phase-Fresnel lenses, radial-dephasing lenses, stepped spiral-phase lenses, or combinations of these forms. Alternatively, microlenses of a simpler form can be employed in conjunction with a null-generating optical element in masking-wavelength projection optics. The dual-wavelength radiation patterns can also be generated by imaging source-spot arrays through projection optics and onto the photochromic layer, without using an intermediate microlens array. In a variation of this approach, the radiation patterns can be generated from tandem-scanning photomasks rather than source-spot arrays.

While the above is a complete description of specific embodiments of the invention, the above description should not be taken as limiting the scope of the invention as defined by the claims.

What is claimed is:

1. A dual-wavelength, stepped, spiral-phase lens, which is configured to receive radiation at first and second wavelengths and direct the radiation onto a photochromic layer, wherein:
   the lens has an optical axis, wherein the axis intercepts the photochromic layer and the first-wavelength and second-wavelength incident radiation is directed along the axis,
   the lens comprises a dephasing surface having phase steps, which partition the surface into at least three zones;
   the zones are all configured to focus at least a substantial portion of the incident first-wavelength radiation toward a common first focal point proximate the photochromic layer;
   the zones are all further configured to focus at least a substantial portion of the incident second-wavelength radiation toward a common second focal point coinciding with or proximate the first focal point;
   the phase steps are configured so that the dephasing surface's azimuthally-averaged complex amplitude transmittance around the axis is zero for the second-wavelength radiation, whereby the dephasing surface induces a second-wavelength optical null along the optical axis and at the axial intercept on the photochromic layer;
   the phase steps are further configured to preserve phase coherence between portions of the first-wavelength radiation transmitting through the zones, whereby the lens achieves high radiant intensity of the first-wavelength radiation at a focused-radiation spot on the photochromic layer, at the optical null; and
   the second-wavelength radiation induces first-wavelength optical absorbance in the photochromic layer, thereby creating a sub-wavelength optical transmittance window in the photochromic layer at the optical null through which the first-wavelength radiation transmits.

* * * * *